(12) United States Patent
Choi et al.

(10) Patent No.: US 8,329,381 B2
(45) Date of Patent: Dec. 11, 2012

(54) PATTERN FORMING METHOD

(75) Inventors: Jin Choi, Yongin-si (KR); Byung-Gook Kim, Seoul (KR); Hee-Bom Kim, Hwaseong-si (KR); Sang-Hee Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/399,090

(22) Filed: Feb. 17, 2012

(65) Prior Publication Data

US 2012/0148959 A1     Jun. 14, 2012

Related U.S. Application Data

(63) Continuation-in-part of application No. 12/662,402, filed on Apr. 15, 2010, now abandoned.

(30) Foreign Application Priority Data

Apr. 16, 2009 (KR) .................. 10-2009-0033232
Feb. 6, 2012 (KR) .................. 10-2012-0011865

(51) Int. Cl.
*G03C 5/00* (2006.01)

(52) U.S. Cl. ......... 430/296; 430/328; 430/394; 430/942

(58) Field of Classification Search .................. 430/296, 430/328, 394, 942
See application file for complete search history.

(56) References Cited

U.S. PATENT DOCUMENTS

| 5,082,762 | A | 1/1992 | Takahashi |
| 6,214,498 | B1 | 4/2001 | Choi |

FOREIGN PATENT DOCUMENTS

| JP | 2007-173609 A | 7/2007 |
| KR | 1998-011696 A | 4/1998 |
| KR | 10-2000-0060497 A | 10/2000 |
| KR | 10-2006-0078837 A | 7/2006 |
| KR | 10-2006-0128122 A | 12/2006 |
| KR | 10-2009-086821 A | 8/2009 |

*Primary Examiner* — Christopher Young
(74) *Attorney, Agent, or Firm* — Lee & Morse, P.C.

(57) ABSTRACT

A pattern forming method includes providing a first mask with a first aperture, forming a first transfer pattern on a resist by irradiating a first electron beam through the first aperture, the first transfer pattern extending in a first direction and having a boundary along a circumference thereof, and the first electron beam having a cross section of a first square when emerging from the first aperture, and forming a second transfer pattern on the resist by irradiating a second electron beam through the first aperture, the second transfer pattern extending in the first direction and overlapping a portion the boundary of the first transfer pattern, and the second electron beam having a cross section of a second square when emerging from the first aperture.

20 Claims, 15 Drawing Sheets

PATTERN FORMING METHOD

CROSS-REFERENCE TO RELATED APPLICATION

This application is a continuation-in-part application of U.S. patent application Ser. No. 12/662,402, filed on Apr. 15, 2010, now abandoned which claims priority based on Korean Patent Application No. 10-2009-0033232, filed on Apr. 16, 2009, in the Korean Intellectual Property Office, and further claims priority based on Korean Patent Application No. 10-2012-0011865, filed on Feb. 6, 2012, in the Korean Intellectual Property, the entire contents of all of which are hereby incorporated by reference in their entirety for all purposes.

BACKGROUND

1. Field

Example embodiments relate to forming patterns, and more particularly, to a method of forming patterns in a semiconductor process by an electron beam writer.

2. Description of the Related Art

As semiconductor devices become more highly integrated, the width of patterns formed on a substrate and gaps between the patterns are reduced. Accordingly, this has led to the development of various lithographic technologies for forming patterns. In conventional reduction projection lithography using ultraviolet light, however, spatial resolution is limited by the wavelength of exposure light used to separate patterns. For this reason, the conventional reduction projection lithography has limitations in forming patterns of semiconductor devices which have fine design rules. Thus, attempts have been made to use electron beam lithography using an electron beam to form fine patterns.

Electron beam lithography using an electron beam is a technology for forming a material layer on an entire surface of a substrate and patterning the material layer in a desired shape. That is, the material layer is coated with a resist, and desired resist patterns are written on the resist with an electron beam. Then, the resist is developed, and the material layer is etched using the resist patterns as a mask. Electron beam lithography can be used to form predetermined material layer patterns, which form an integrated circuit, directly on a substrate.

SUMMARY

Aspects of example embodiments provide a pattern forming method in which a dose of electrons irradiated to a peripheral region of a pattern to be formed is increased in order to reduce line edge roughness (LER) of the pattern.

Aspects of example embodiments also provide a pattern forming method in which regions are defined in a resist and patterns are formed in the defined regions in order to minimize the proximity effect of the patterns, the method employed to form cell blocks of a semiconductor device using the above pattern forming method.

However, aspects of the example embodiment are not restricted to the one set forth herein. The above and other aspects of the example embodiment will become more apparent to one of ordinary skill in the art to which the example embodiment pertains by referencing the detailed description of the example embodiment given below.

According to an aspect of the example embodiment, there is provided a pattern forming method including providing a first mask with a first aperture, forming a first transfer pattern on a resist by irradiating a first electron beam through the first aperture, the first transfer pattern extending in a first direction and having a boundary along a circumference thereof, and the first electron beam having a cross section of a first square when emerging from the first aperture, and forming a second transfer pattern on the resist by irradiating a second electron beam through the first aperture, the second transfer pattern extending in the first direction and overlapping a portion the boundary of the first transfer pattern, and the second electron beam having a cross section of a second square when emerging from the first aperture.

The method may further include forming at least one first transfer pattern in the second direction different from the first direction, and forming the second transfer pattern in the second direction.

The first transfer pattern, the second transfer pattern, and the overlapped portion of the boundary may have equal lengths in the first direction, the first transfer pattern being longer than the second transfer pattern in a second direction different from the first direction.

The first square may be an overlap region between the first aperture and a first pre-electron beam, the second square may be an overlap region between the first aperture and a second pre-electron beam, and the first square and the second square may have equal lengths in the first direction, the first square being longer than the second square in a second direction different from the first direction.

The overlap region between the first aperture and the first pre-electron beam may include the overlap region between the first aperture and the second pre-electron beam.

Forming the second transfer pattern may include irradiating a dose of electrons per unit area that is higher than a dose of electrons irradiated per unit area to form the first transfer pattern.

Forming the second transfer pattern may include irradiating the second electron beam at a higher intensity than the first electron beam.

The second transfer pattern may be formed within the first transfer pattern.

The method may further include providing a second mask with a second aperture, such that a shaping deflector is positioned between the first and second masks, irradiating a first pre-electron beam sequentially through the first aperture of the first mask, the shaping deflector, and the second aperture of the second mask to form the first electron beam, such that the first electron beam emerging from the second aperture has a cross section that is an overlap region between the first square and the second aperture of the second mask, and irradiating a second pre-electron beam sequentially through the first aperture of the first mask, the shaping deflector, and the second aperture of the second mask to form the second electron beam, such that the second electron beam emerging from the second aperture has a cross section that is an overlap region between the second square and the second aperture of the second mask.

The method may further include changing a size of a cross section of the first pre-electron beam incident on the first mask and a size of a cross section of the second pre-electron beam incident on the first mask by changing a size of the second aperture.

The second mask may include two L-shaped structures defining the second aperture, changing the size of the second aperture may include moving the two L-shaped structures.

The method may further include electrically connecting a plurality of amplifiers to the shaping deflector, and controlling outputs of the amplifiers to adjust the cross section of the second electron beam that is an overlap region between the second square and the second aperture of the second mask.

According to another aspect of the example embodiment, there is provided a pattern forming method including providing a first mask with a first aperture, providing a second mask with a second aperture, a shaping deflector being positioned between the first and second masks, irradiating a first pre-electron beam sequentially through the first aperture, the shaping deflector, and the second aperture to form a first electron beam, a cross-section of the first electron beam being defined by a first overlap between the first and second apertures, irradiating the first electron beam on a resist to form a first transfer pattern, irradiating a second pre-electron beam sequentially through the first aperture, the shaping deflector, and the second aperture to form a second electron beam, a cross-section of the second electron beam being defined by a second overlap between the first and second apertures, and irradiating the second electron beam on a resist to form a second transfer pattern, the second transfer pattern overlapping a portion of a boundary of the first transfer pattern.

Irradiating the second electron beam may include forming the second transfer pattern only on portions of the boundary of the first transfer pattern, such that the second transfer pattern does not overlap a central portion of the first transfer pattern.

Irradiating the first and second electron beams may include irradiating electron beams having different cross-sections, the cross-section of the second electron beam being substantially smaller than that of the first electron beam.

Defining the cross-section of the second electron beam may include adjusting an electric field generated by the shaping deflector, such that a path of the second electron beam is controlled to be incident on a predetermined region of the second mask.

Controlling the second electron beam to be incident on the predetermined region of the second mask may include controlling a size and a shape of the second overlap.

According to yet another aspect of the example embodiment, there is provided a pattern forming method including providing a resist, a cell block being defined in the resist, forming a first transfer pattern in the cell block by irradiating a first electron beam, the first transfer pattern extending in a first direction and having a boundary along a circumference thereof, and the first electron beam having a cross section of a first square, and forming a second transfer pattern in the cell block by irradiating a second electron beam, the second transfer pattern extending in the first direction and having regions that overlap portions of the boundary, and the second electron beam having a cross section of a second square, wherein the cell block includes a central region, a transition region surrounding the central region, and a peripheral region surrounding the transition region, a width of the second transfer pattern being reduced from the central region toward the peripheral region.

The second transfer pattern having a predetermined width may be formed in the central region, the first transfer pattern only being formed in the peripheral region, and the second transfer pattern being formed in the transition region, such that the width thereof is gradually reduced as a distance to the peripheral region decreases.

The first electron beam may be formed by passing a first pre-electron beam through a first aperture in a first mask, the first square being an overlap region between the first aperture and the first pre-electron beam, the second electron beam may be formed by passing a second pre-electron beam through the first aperture, the second square being an overlap region between the first aperture and the second pre-electron beam, and the first square and the second square may have equal lengths in the first direction, the first square being longer than the second square in a second direction different from the first direction.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
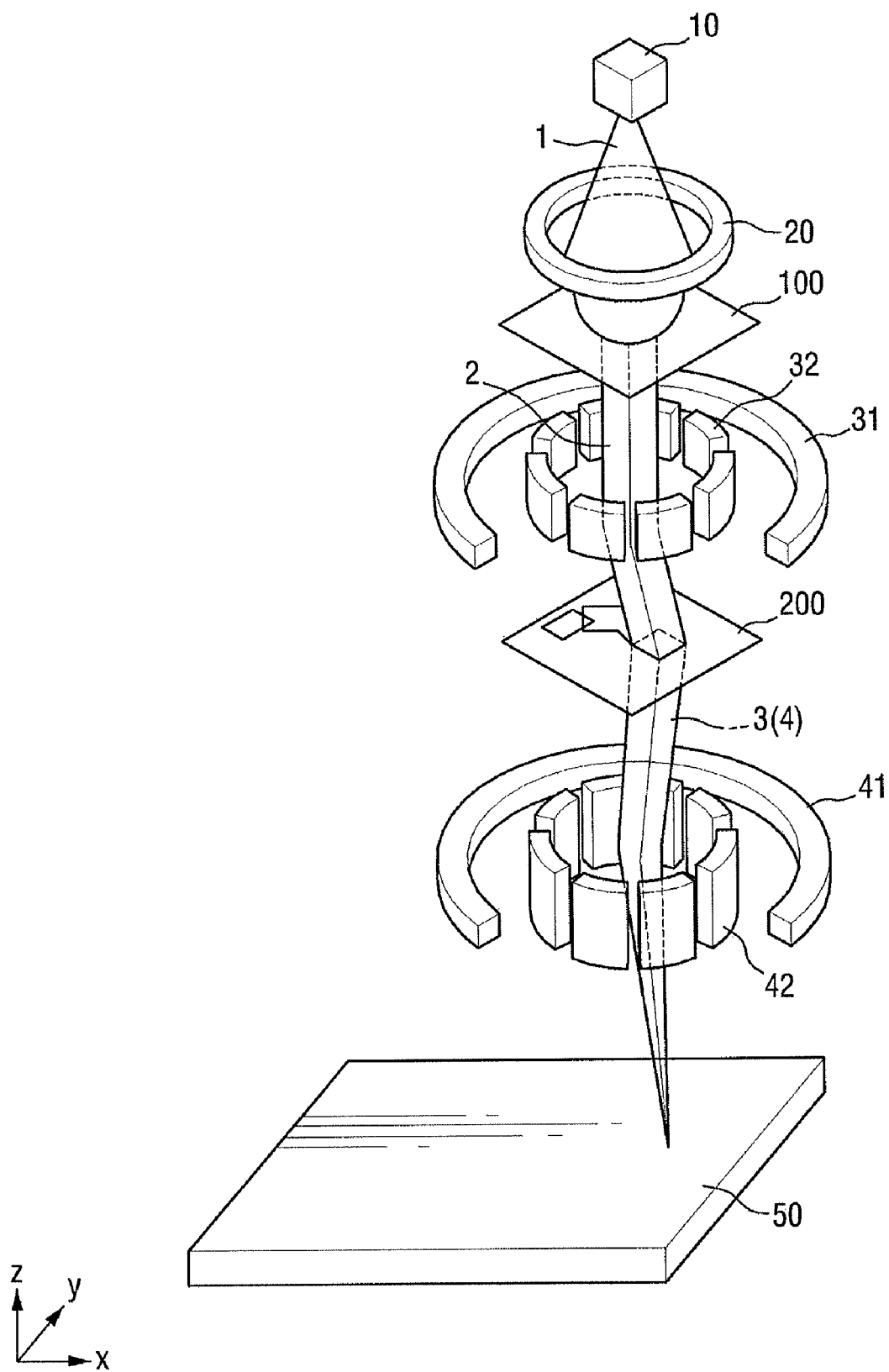
FIG. 1 illustrates a schematic diagram of an electron beam writer used in the example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the inventive scope to those skilled in the art.

In the drawing figures, the dimensions of layers and regions may be exaggerated for clarity of illustration. It will also be understood that when a layer or element is referred to as being "on," "connected to," or "coupled to" another layer or substrate, it can be directly on, connected to, or coupled to the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the example embodiment.

The use of the terms "a" and "an" and "the" and similar referents in the context of describing the example embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, an electron beam writer used in pattern forming methods according to example embodiments will be described with reference to FIGS. 1 through 3.

FIG. 1 is a schematic diagram of an electron beam writer used in the example embodiments. FIG. 2 is a diagram of a first mask 100 used in the electron beam writer of FIG. 1. FIG. 3 is a diagram of a second mask 200 used in the electron beam writer of FIG. 1.

Referring to FIG. 1, the electron beam writer may include an electron gun 10, a condenser lens 20, the first mask 100, a projection lens 31, a shaping deflector 32, the second mask 200, an objective lens 41, a main deflector 42, and a stage 50.

The electron gun 10 generates a pre-electron beam 1 using electron current. The pre-electron beam 1 is called as such in order to refer to a non-shaped beam emerging from the electron gun 10 as an electron beam. Therefore, the pre-electron beam 1 is an electron beam before being shaped by the first or second masks 100, 200. The electron gun 10 passes hot electrons from a cathode through one or more, e.g., donut-shaped, electrodes with a hole in the middle, thereby focusing the hot electrons. Then, the electron gun 10 emits the focused hot electrons in the form of a beam. Here, the focused hot electrons are accelerated at high speed.

The pre-electron beam 1 emitted from the electron gun 10 may pass through the condenser lens 20. The condenser lens 20 concentrates the pre-electron beam 1 onto a first aperture 102 (see FIG. 2) of the first mask 100. In detail, the pre-electron beam 1 emitted from the electron gun 10 may be spread, e.g., dispersed, at an angle by a repulsive force between electrons that form the pre-electron beam 1. That is, the repulsive force between the electrons may cause the pre-electron beam 1 to have a Gaussian distribution. The intensity of the pre-electron beam 1 may vary significantly according to the angle at which the pre-electron beam 1 is spread. Therefore, the pre-electron beam 1 is passed through the first aperture 102 of the first mask 100 to obtain substantially uniform intensity. Passing the pre-electron beam 1 through the first aperture 102 of the first mask 100 may result in loss of the pre-electron beam 1. However, it is conducted to improve the quality of a pattern to be formed.

The condenser lens 20, which concentrates the pre-electron beam 1, may include an electromagnet (not shown). When an electric field is applied to the pre-electron beam 1 by the electromagnet, an electromagnetic force of the electric field concentrates the pre-electron beam 1. That is, when a negative electromagnetic force greater than the repulsive force between the electrons of the pre-electron beam 1 is applied to the pre-electron beam 1, a repulsive force is created between the negative electromagnetic force and the pre-electron beam 1. This repulsive force concentrates the pre-electron beam 1.

The pre-electron beam 1 concentrated by the condenser lens 20 may pass through the first aperture 102 in the first mask 100. As the pre-electron beam 1 passes through the first aperture 102, a cross section of the pre-electron beam 1 may be shaped by the first aperture 102. Only a portion of the pre-electron beam 1, i.e., a portion with substantially uniform intensity, may be passed through the first aperture 102 of the first mask 100 to emerge as a pre-electron beam 2. The first mask 100 may be made of an insulating material in order to eliminate an electromagnetic effect between itself and the pre-electron beam 1.

The pre-electron beam 2, i.e., a beam emerging from the first mask 100 and having the cross section of the first aperture 102, is transmitted through the projection lens 31 and the shaping deflector 32 toward a second mask 200. The projection lens 31 and the shaping deflector 32 may change the path of the pre-electron beam 2 using an electric field. That is, the projection lens 31 and the shaping deflector 32 may change the path of the pre-electron beam 2 along a first direction and/or a second direction, e.g., along a y direction or an x direction, such that the pre-electron beam 2 proceeds to a predetermined region of a second aperture 202 in the second mask 200 (FIG. 3). The predetermined region of the second mask 200 may correspond to a region of a resist 300 (see FIG. 4) to be subsequently irradiated to form patterns.

In detail, a plurality of amplifiers (not shown) may be electrically connected to the shaping deflector 32. Each amplifier connected to the shaping deflector 32 may change the path of the pre-electron beam 2 to a first direction y or a second direction x. Therefore, the path of the pre-electron beam 2 is changed by the outputs of the amplifiers connected to the shaping deflector 32. In other words, the amplifiers of the shaping deflector 32 may adjust an incidence position of the pre-electron beam 2 on the second mask 200, i.e., a location where the pre-electron beam 2 passes through the second aperture 202 of the second mask 200. As such, the amplifiers of the shaping deflector 32 may adjust a cross-sectional area of a beam emerging from the second mask, i.e., an electron beam 3 or 4, as the cross-section area of the emerging beam may correspond to an overlap area of the pre-electron beam 2 and the predetermined region of the second aperture 202 overlapping therewith. The cross-sectional area of the emerging beam may vary according to the number of amplifiers which produce outputs, among the amplifiers connected to the shaping deflector 32. The emerging beam, i.e., the electron beam 3 or 4, may be incident on the resist 300, e.g., the resist 300 may be positioned on the stage 50, to form patterns. Therefore, the shaping deflector 32 may change, e.g., adjust, the shape and location of a region of the resist 300 (see FIG. 4) to be irradiated with the electron beam 3 or 4 emerging from the second aperture 202.

The pre-electron beam 2 that passes through the projection lens 31 and the shaping deflector 32 may be transmitted through the second mask 200. Here, the pre-electron beam 2 may pass through the second aperture 202 formed in the second mask 200. As the pre-electron beam 2 passes through the second aperture 202, the cross section of the pre-electron beam 2 may be shaped by the second aperture 202. The second mask 200 may be made of an insulating material in order to eliminate the electromagnetic effect between itself and the pre-electron beam 2. When a pre-electron beam passes sequentially through the first aperture 102 of the first mask 100 and the second aperture 202 of the second mask 200, a final shape of the electron beam 3 or 4, i.e., a shape to be irradiated onto the resist 300 (see FIG. 4), may be defined. This will be described in greater detail later.

To make the electron beam 3 or 4 have a cross-sectional shape identical to a shape of a pattern to be formed, the second mask 200 may rotate about a virtual axis which corresponds to the direction of the electron beam. In addition, the second mask 200 may move in a direction parallel to the direction of the electron beam or in a plane perpendicular to the direction of the electron beam, e.g., the second mask 200 may move in three different directions perpendicular to each other. To this end, the electron beam writer may include a second mask driver (not shown).

The electron beam 3 or 4 that emerges from the second mask 200 may be transmitted through the objective lens 41 and the main deflector 42 before being irradiated onto the resist 300. The objective lens 41 and the main deflector 42 may reduce the size of the electron beam 3 or 4 that is to be irradiated onto the resist 300. This is to match a designed pattern (such as a circuit linewidth) with a resist pattern that is to be formed by irradiation of the electron beam 3 or 4. The objective lens 41 and the main deflector 42 may adjust the cross-sectional width of the electron beam 3 or 4 to a desired linewidth of a semiconductor circuit, e.g., a linewidth of several nm to several μm. In addition, the objective lens 41 and the main deflector 42 may change the path of the electron beam 3 or 4, such that the electron beam 3 or 4 may reach a region of the resist 300 in which a pattern is to be formed.

The objective lens 41 may include an absorption plate (not shown). The absorption plate may be installed on a bottom surface of the objective lens 41. The absorption plate may reduce rescattering of an irradiated electron beam, thereby ensuring formation of a high-resolution pattern.

An object on which a pattern is to be formed may be placed on the stage 50. For example, an object having a resist on a substrate may be placed on the stage 50. The stage 50 may move along x and/or y directions during a pattern forming process. Since the object is moved by the stage 50, various patterns can be formed on the object even if the path of the electron beam is fixed in one direction.

Figure 2:
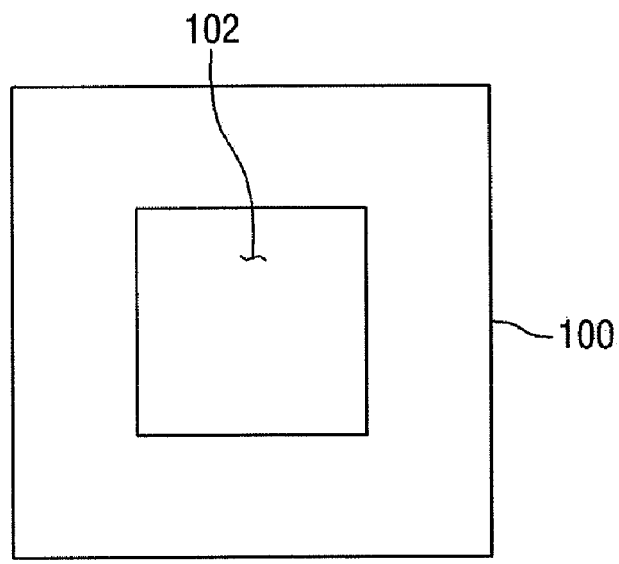
FIG. 2 illustrates a diagram of a first mask used in the electron beam writer of FIG. 1.

Referring to FIG. 2, the first aperture 102 formed in the first mask 100 may be, e.g., square. However, the shape of the first aperture 102 is not limited to the square shape, e.g., the first aperture 102 may have triangular, pentagonal, hexagonal, or other polygonal shapes. In FIG. 2, the first aperture 102 formed in the first mask 100 has a fixed size. However, the example embodiment is not limited thereto, e.g., the first aperture 102 may have a variable size. This will be described in greater detail later with reference to FIG. 9.

The cross-sectional shape of the pre-electron beam 2 that emerges from the first aperture 102 may be determined by the shape of the first aperture 102. For example, when the first aperture 102 is square, as shown in FIG. 2, the pre-electron beam 2 that emerges from the first aperture 102 may have a square cross section.

Figure 3:
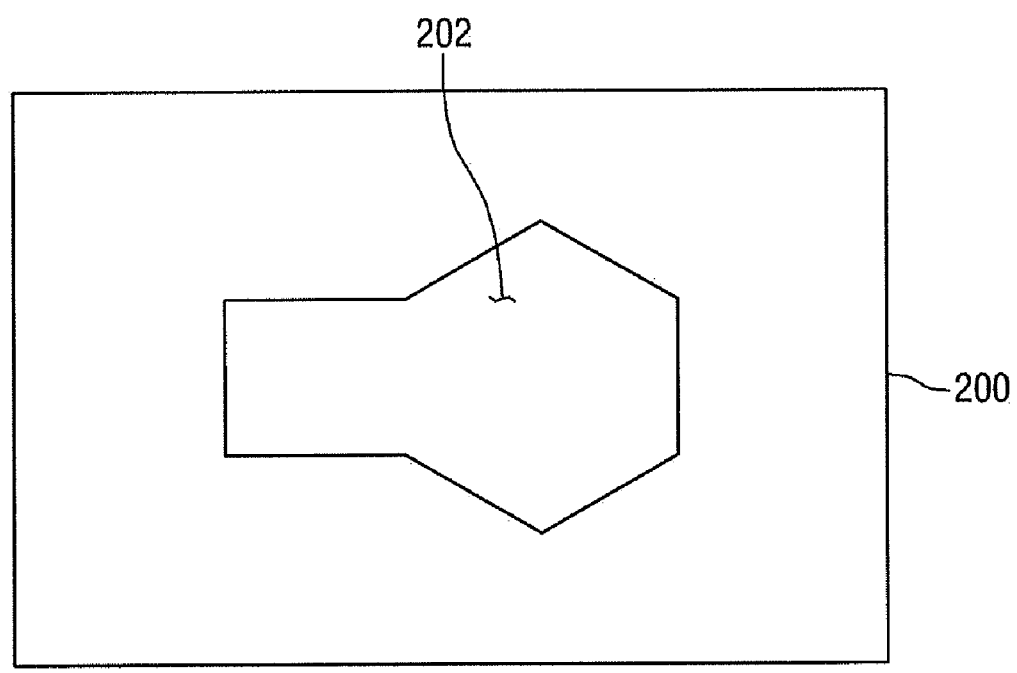
FIG. 3 illustrates a diagram of a second mask used in the electron beam writer of FIG. 1.

Referring to FIG. 3, the second aperture 202 formed in the second mask 200 may be polygonal. For example, the second aperture 202 may have a polygonal shape shown in FIG. 3, i.e., a combination of various polygons. However, the shape of the second aperture 202 is not limited to the polygonal shape shown in FIG. 3. In the pattern forming methods according to the example embodiment, only one aperture is formed in the second mask 200 as illustrated in the drawings. However, example embodiments are not limited to the illustrated shape, and a different shape than the illustrated shape, e.g., a narrow slit or a shape having a curved surface with various radii of curvature, may be formed in view of the shape of a pattern to be formed.

The cross-sectional shape of the electron beam 3 or 4 that emerges from the second aperture 202 may be determined by the shapes of the first aperture 102 and the second aperture 202. For example, when the first aperture 102 and the second aperture 202 are square, the electron beam 3 or 4 that emerges from the second aperture 202 may have a square cross-section or a cross section resulting from an overlap of two square cross-sections. That is, the cross-sectional shape of the electron beam 3 or 4 irradiated to the resist 300 (see FIG. 4) may be an overlap between the shape of the first aperture 102 and the shape of the second aperture 202.

Hereinafter, a pattern forming method according to example embodiments will be described with reference to FIGS. 4 through 8.

Figure 4:
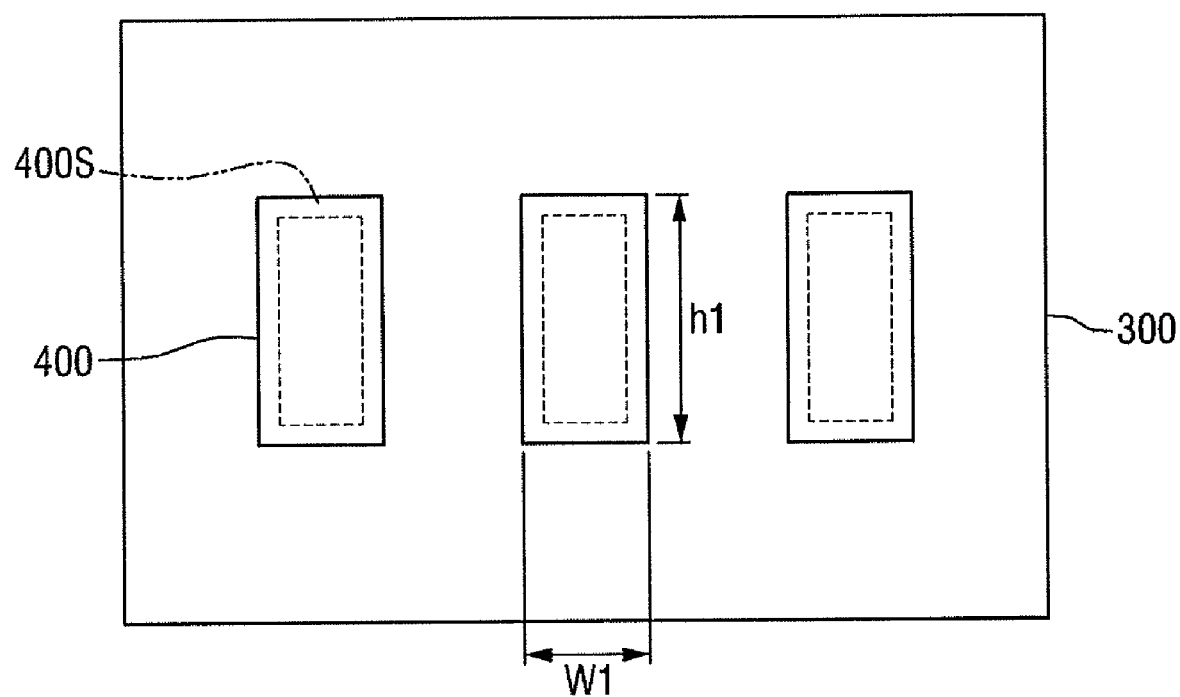
FIG. 4 illustrates a diagram of a first transfer pattern formed on a resist in a pattern forming method according to an embodiment of the example embodiment.
Figure 5:
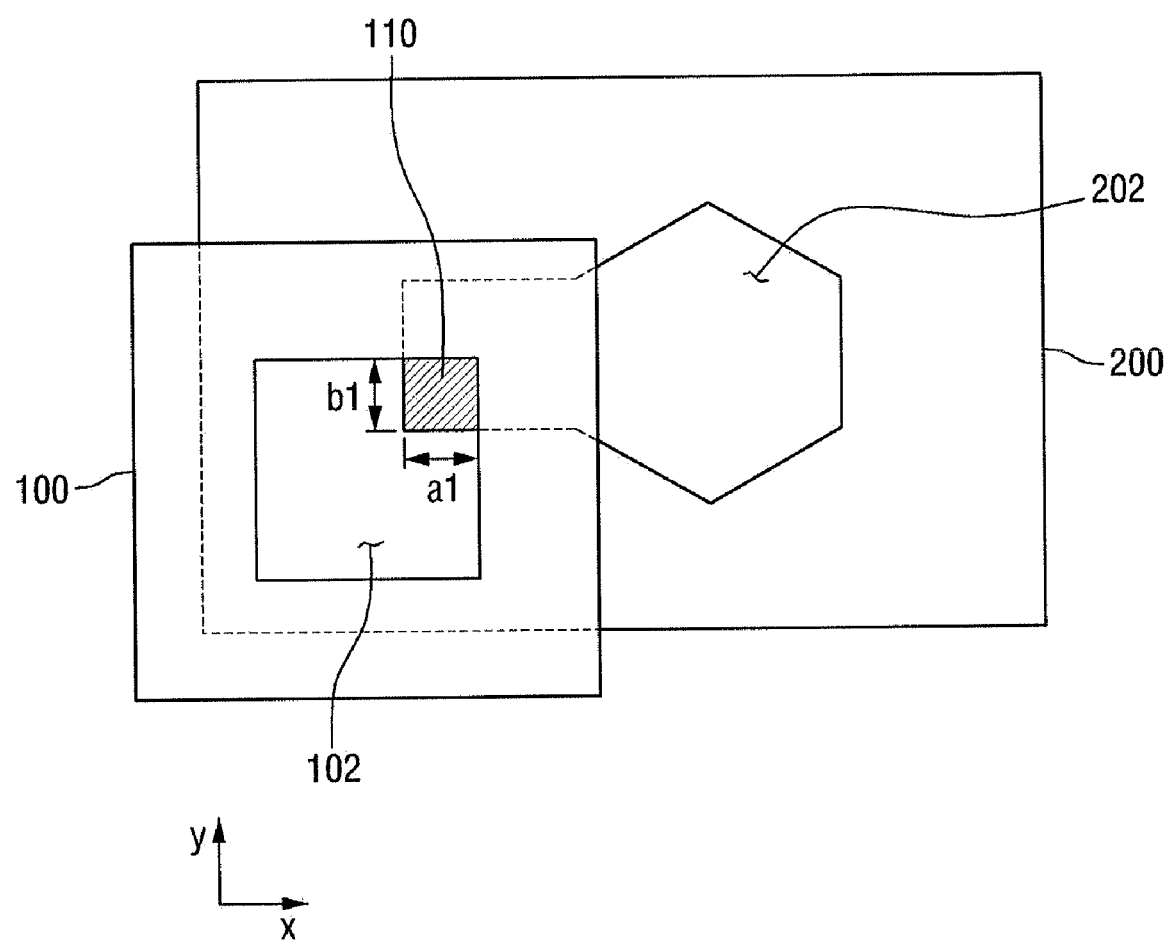
FIG. 5 illustrates a diagram illustrating the positional relationship between the first and second masks when used to form the first transfer pattern of FIG. 4.
Figure 6A:
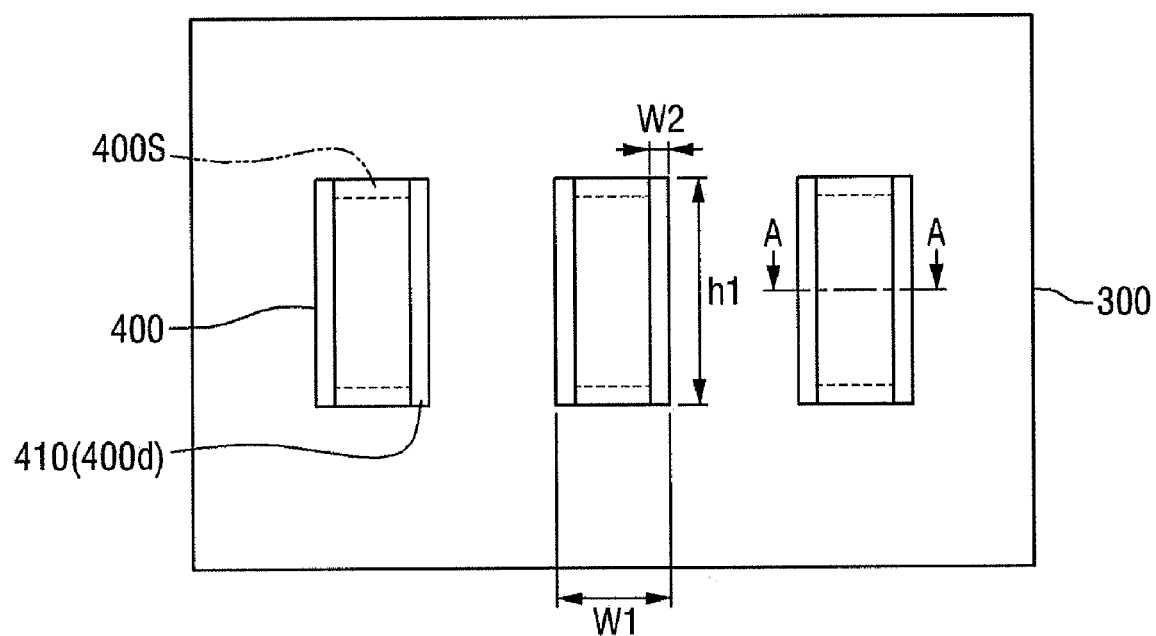
FIGS. 6A and 6B illustrate diagrams of a second transfer pattern and a third transfer pattern formed on the resist in the pattern forming method according to the embodiment of FIG. 4.
Figure 6B:
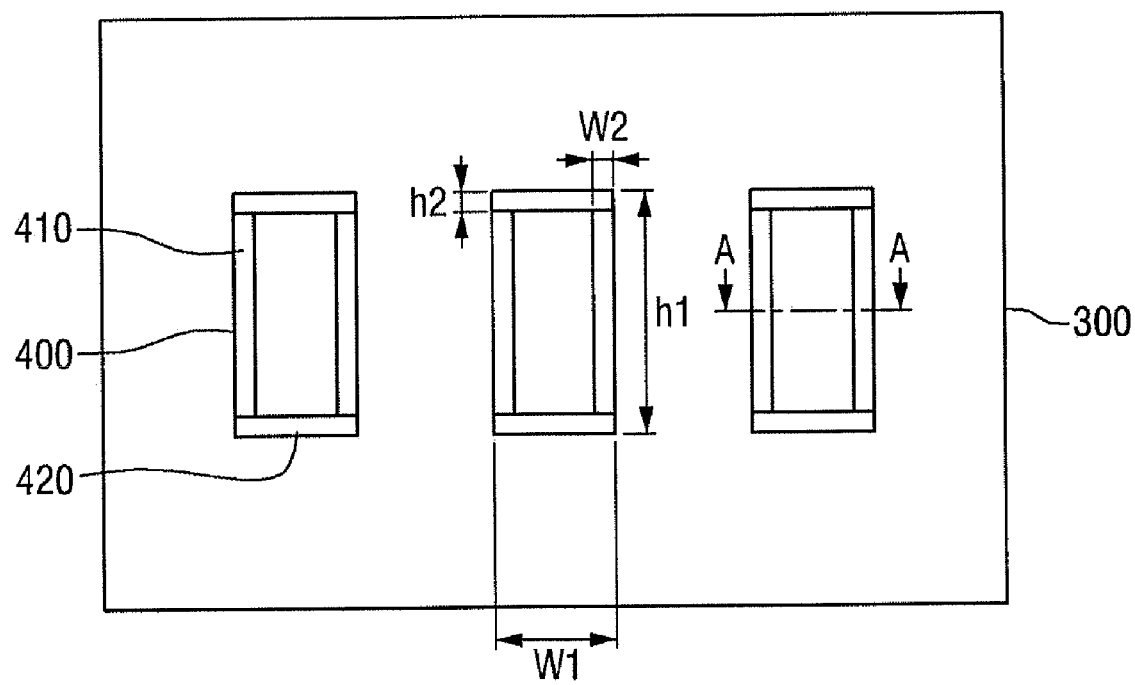
Figure 7A:
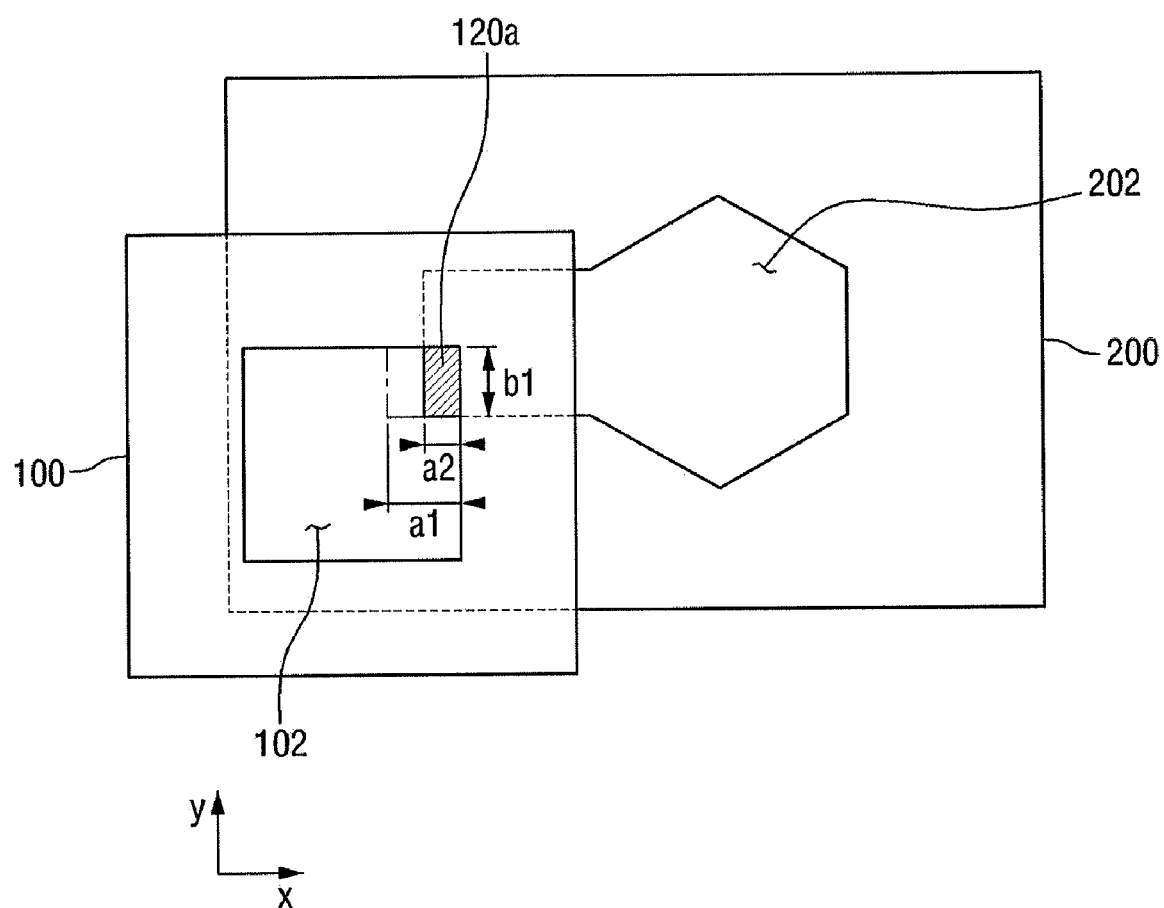
FIGS. 7A and 7B illustrate diagrams illustrating the positional relationship between the first and second masks when used to form the second transfer pattern of FIG. 6A.
Figure 7B:
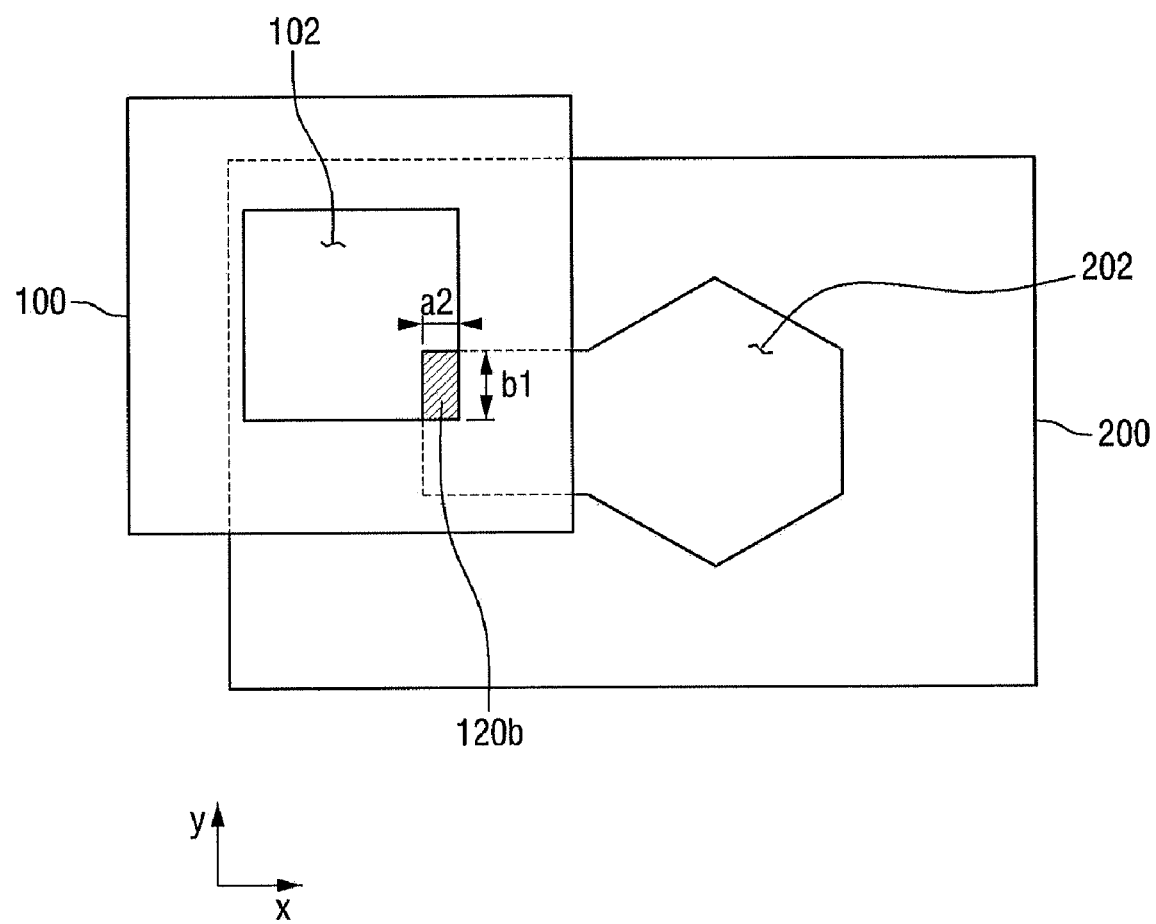

FIG. 4 is a diagram of a first transfer pattern 400 formed on the resist 300 in a pattern forming method according to example embodiments. FIG. 5 is a diagram illustrating the positional relationship between the first and second masks 102 and 202 when used to form the first transfer pattern 400 of FIG. 4, FIGS. 6A and 6B are diagrams of a second transfer pattern 410 and a third transfer pattern 420 formed on the resist 300 in the pattern forming method according to the embodiment of FIG. 4, FIGS. 7A and 7B are diagrams illustrating the positional relationship between the first and second masks 102 and 202 when used to form the second transfer pattern 410 of FIG. 6A, and FIG. 8 is a cross-sectional view along line A-A of FIG. 6A and a graph illustrating the dose of electron beam irradiation to each region.

Figure 8:
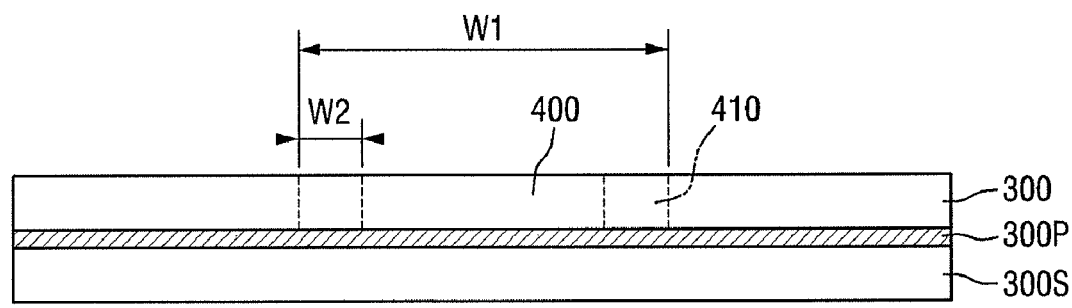
FIG. 8 illustrates a cross-sectional view taken along the line A-A of FIG. 6A and a graph illustrating the dose of electron beam irradiation to each region.
Figure 8:
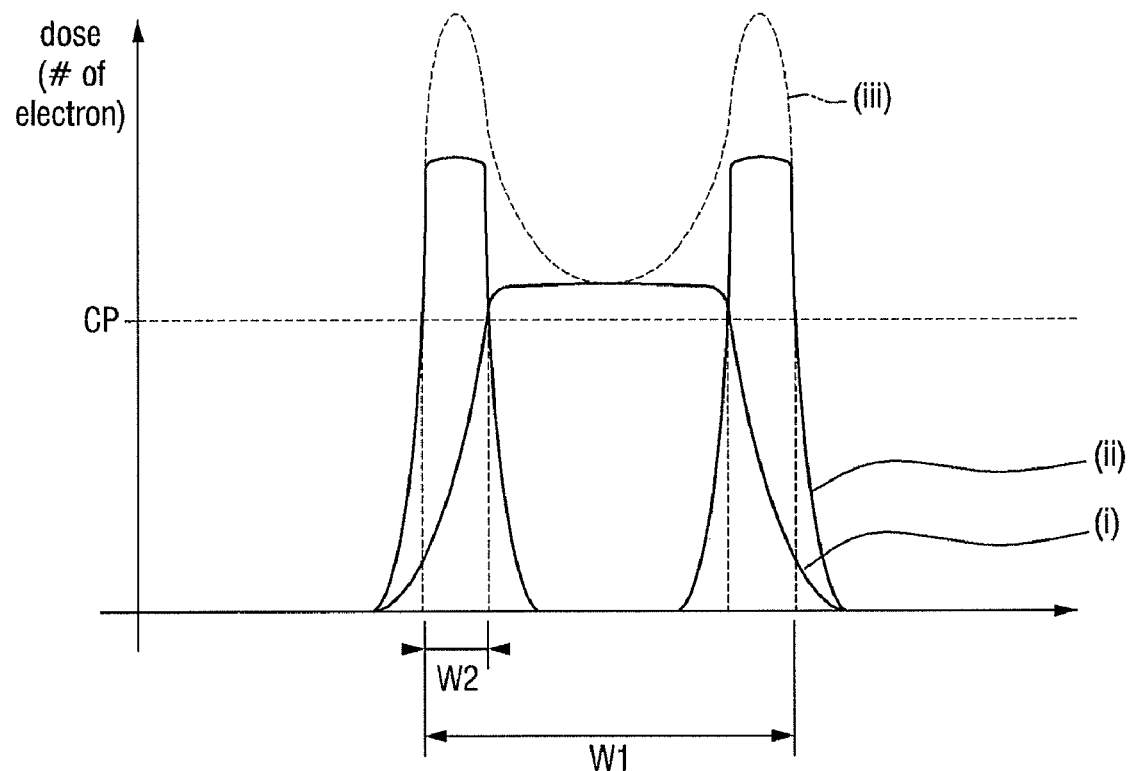

Referring to FIGS. 1 and 4-8, a pattern including the first transfer pattern 400, the second transfer pattern 410, and the third transfer pattern 420 may be formed on the resist 300. That is, as illustrated in FIG. 8, the resist 300 may be coated on a substrate 300s. Next, as illustrated in FIGS. 4-5, the electron beam 3 may be used to form the first transfer pattern 400 on the resist 300 to extend in the first direction y. Then, as illustrated in FIGS. 6A-7B, the electron beam 4 may be used to form the second transfer pattern 410 and the third transfer pattern 420 on a boundary 400s (FIG. 6A) of the first transfer pattern 400. Using the first through third transfer patterns 400 through 420, a photomask pattern or a mask pattern as a unit process of a semiconductor process may be formed on the substrate 300s. That is, the beams 3 and 4 incident on the resist 300 to form the first transfer pattern 400 and the second/third transfer pattern 410/420, respectively, may be generated by the same electron gun 10. Further, while each of the beams 3 and 4 may be transmitted sequentially through the same first and second masks 102 and 202, each of the beams 3 and 4 may pass through a deflector to have a different cross-section and to be incident on a different region of the resist 300.

In detail, referring to FIGS. 1, 4, 5 and 8, the first electron beam 3 emerging from the second aperture 202 in the second mask 200 may be irradiated onto the resist 300 coated on the substrate 300s, e.g., both of which may be positioned on the stage 50. For example, a cross section of the first electron beam 3 may be a first square 110, as illustrated in FIG. 5. The irradiated first electron beam 3 may be incident on the resist 300 to form the first transfer pattern 400 on the resist 300. As illustrated in FIG. 4, the first transfer pattern 400 may extend in the first direction y, and may have the boundary 400s along a circumference thereof.

Referring to FIG. 8, a light-blocking film 300p and the resist 300 may be sequentially stacked on the substrate 300s. The substrate 300s may be made of a transparent material, e.g., glass or quartz. In a subsequent process, the light-blocking film 300p may be changed into a light-blocking pattern having a predetermined critical dimension (CD) design value. The resist 300 may be developed to have a predetermined CD design value by irradiating an electron beam thereto. Accordingly, the light-blocking film 300p may be patterned. The resist 300 may be a negative resist, i.e., in which a region of the resist that is exposed to an electron beam remains after being developed, or a positive resist, i.e., in which a region of the resist that is exposed to an electron beam is removed after being developed. In the pattern forming method according to the current embodiment, a method of forming a photomask pattern will be described as an example. However, the example embodiment is not limited to this example. The pattern forming method according to the example embodiment can also be used to form a pattern on a semiconductor material. For example, the light-blocking film 300p may be, e.g., an insulating material on which a mask pattern is to be formed, and the substrate 300s may be, e.g., a semiconductor material on which a semiconductor pattern is to be formed.

Referring to FIGS. 1 and 5, a first pre-electron beam 1 irradiated to the first mask 100 passes sequentially through the first aperture 102 of the first mask 100 and the second aperture 202 of the second mask 200, thereby forming the first electron beam 3 whose cross-section is the first square 110. The cross section of the first electron beam 3 is an overlap region between the first aperture 102 in the first mask 100 and the second aperture 202 in the second mask 200. That is, the first square 110 is substantially identical to the overlap region between the first aperture 102 in the first mask 100 and the second aperture 202 in the second mask 200. The first square 110 which is the cross section of the first electron beam 3 has a length of a1 in the second direction x and a length of b1 in the first direction y. The first square 110 which is the overlap region of the first aperture 102 and the second aperture 202 may be formed by moving the first mask 100 and the second mask 200. Alternatively, the first square 110 may be formed by changing the path of the first pre-electron beam 2, which emerges from the first aperture 102, using the shaping deflector 32. That is, the area of the first square 110 can be adjusted by controlling the outputs of the amplifiers connected to the shaping deflector 32.

In detail, the first pre-electron beam 1 emitted from the electron gun 10 may be concentrated by the condenser lens 20. The concentrated first pre-electron beam 1 may pass through the first aperture 102 in the first mask 100. As a result, the first pre-electron beam 2 having the cross section of the first aperture 102 may emerge from the first aperture 102. The path of the first pre-electron beam 2 emerging from the first aperture 102 may be changed by the shaping deflector 32 and the projection lens 31. The first pre-electron beam 2, whose path has been changed, may be directed to be incident at a desired location on the second mask 200. The first pre-electron beam 2 emerging from the first aperture 102 may pass through the second aperture 202 in the second mask 200, thereby forming the first electron beam 3. Here, the first square 110 which is the cross section of the first electron beam 3 may be an overlap region between the second aperture 202 and the first pre-electron beam 2 emerging from the first aperture 102.

Referring to FIGS. 1 and 4, the first electron beam 3 may be irradiated onto the resist 300, thereby forming the first transfer pattern 400. The first transfer pattern 400 extends in the first direction y and has the boundary 400s defined along the circumference thereof. That is, the first transfer pattern 400 is surrounded by the boundary 400s. It is noted that the first transfer pattern 400, excluding the boundary 400s, is a region of the resist 300 which was exposed to a sufficient dose of electrons. It is further noted that the boundary 400s of the first transfer pattern 400 is a region of the resist 300 which may have not received sufficient exposure to a dose of electrons. Therefore, after being developed, the first transfer pattern 400 may have line edge roughness (LER) in the boundary 400s corresponding to the region of the resist 300 which was not exposed to a sufficient dose of electrons. In other words, as the boundary 400s was insufficiently exposed to the first electron beam 3, the LER in the boundary 400s may be relatively high.

Referring to FIG. 4, the first transfer pattern 400 has a length of w1 in the second direction x and a length of h1 in the first direction y. The boundary 400s of the first transfer pattern 400 may be a smaller region than the entire region of the first transfer pattern 400. A width of the boundary 400s of the first transfer pattern 400 may vary in proportion to the intensity of the first electron beam 3 and the exposure time.

Referring to FIGS. 1 and 6A through 8, the second electron beam 4 emerging from the second aperture 202 in the second mask 200 may be irradiated onto the resist 300 coated on the substrate 300s in order to provide additional exposure in the boundary 400s. For example, a cross section of the second electron beam 4 may be a second square 120a or 120b (FIGS. 7A-7B). The irradiated second electron beam 4 may form the second transfer pattern 410 on the resist 300 (FIG. 6A). The second transfer pattern 410 includes regions that overlap portions of the boundary 400s of the first transfer pattern 400, which extend in the first direction y. Subsequently, a third electron beam emerging from the second aperture 202 may be irradiated onto the resist 300, e.g., a cross section of the third electron beam may be a third square (not shown). A third transfer pattern 420 may be formed on the resist 300 irradiated with the third electron beam (FIG. 6B). The third transfer pattern 420 includes regions that overlap portions of the boundary 400s of the first transfer pattern 400, which extend in the second direction x. The third transfer pattern 420 may be omitted depending on the shape of a pattern to be formed. For example, the third transfer pattern 420 may be required at both ends of a long pattern that extends in a direction but may not be required in other regions of the pattern.

In detail, referring to FIGS. 1, 7A and 7B, a second pre-electron beam 1 irradiated to the first mask 100 may pass sequentially through the first aperture 102 in the first mask 100 (emerging as the second pre-electron beam 2) and the second aperture 202 in the second mask 200, thereby forming the second electron beam 4 whose cross section is the second square 120a or 120b. The cross section of the second electron beam 4 is an overlap region between the first aperture 102 in the first mask 100 and the second aperture 202 in the second mask 202. That is, the second square 120a or 120b is substantially identical to the overlap region between the first aperture 102 in the first mask 100 and the second aperture 202 in the second mask 200. The second square 120a or 120b which is the cross section of the second electron beam 4 has a length of a2 in the second direction x and a length of b1 in the first direction y. The second square 120a or 120b which is the overlap region of the first aperture 102 and the second aperture 202 may be formed by moving the first mask 100 and the second mask 200. That is, the area of the second electron beam 4 produced after the second pre-electron beam 2 passes through the second aperture 202 can be adjusted by moving the second mask 200. The second square 120a or 120b may also be formed by changing the path of the second pre-electron beam 2, which emerges from the first aperture 102, using the shaping deflector 32.

In further detail, the second pre-electron beam 1 emitted from the electron gun 10 may be concentrated by the condenser lens 20. The concentrated second pre-electron beam 1 may pass through the first aperture 102 in the first mask 100. As a result, the second pre-electron beam 2 having the cross section of the first aperture 102 may emerge from the first aperture 102. In the current embodiment, the path of the second pre-electron beam 2 emerging from the first aperture 102 may be changed by the shaping deflector 32 and the projection lens 31. The second pre-electron beam 2 whose path has been changed by controlling the outputs of the amplifiers connected to the shaping deflector 32 may be positioned at a desired location on the second mask 200. The second pre-electron beam 2 emerging from the first aperture 102 may pass through the second aperture 202 in the second mask 200, thereby forming the second electron beam 4. Here, a location at which the second pre-electron beam 2 is incident on the second mask 200 may be adjusted, and the area of the second electron beam 4 emerging from the second aperture 202 may be adjusted. The second square 120a or 120b which is the cross section of the second electron beam 4 may be an overlap region between the second aperture 202 and the second pre-electron beam 2 emerging from the first aperture 102.

In the pattern forming method according to the current embodiment, the area of the cross section of each of the first electron beam 3 and the second electron beam 4 may be adjusted using the outputs of the amplifiers connected to the shaping deflector 32. Specifically, the amplifiers connected to the shaping deflector 32 and capable of changing the path of a pre-electron beam to the first direction y and the second direction x may produce an output of (M1, N1). Here, the first pre-electron beam 2 emerging from the first aperture 102 may pass through the second aperture 202, thereby forming the first electron beam 3. The area of the cross section of the first electron beam 3 may be the first square 110, and the first square 110 may be an overlap region between the first pre-electron beam 2 and the second aperture 202. Subsequently, the amplifiers connected to the shaping deflector 32 and capable of changing the path of a pre-electron beam to the first direction y and the second direction x may produce an output of (M1, N2). Here, the second pre-electron beam 2 emerging from the first aperture 102 may pass through the second aperture 202, thereby forming the second electron beam 4. As shown in FIG. 7A, the area of the cross section of the second electron beam 4 may be the second square 120a, and the second square 120a may be an overlap region between the second pre-electron beam 2 and the second aperture 202. For example, an output of a first directional (y) amplifier connected to the shaping deflector 32 may be fixed, and an output of a second directional (x) amplifier may be changed. Accordingly, the length a2 of the second square 120a in the second direction x can be changed freely, unlike the illustration of FIG. 7A.

Referring to FIGS. 5, 6A, 7A and 7B, the length b1 of the first square 110 (i.e., the cross section of the first electron beam 3) in the first direction y is equal to the length b1 of the second square 120a or 120b (i.e., the cross section of the second electron beam 4) in the first direction y. However, the length a1 of the first square 110 in the second direction x is greater than the length a2 of the second square 120a or 120b in the second direction x. While the first electron beam 3 whose cross section is the first square 110 forms the first transfer pattern 400, the second electron beam 4 whose cross section is the second square 120a or 120b forms the second transfer pattern 410 which overlaps only the boundary 400s of the first transfer pattern 400. Therefore, the first square 110 which is the cross section of the first electron beam 3 for forming a wider transfer pattern may be larger than the second square 120a or 120b which is the cross section of the second electron beam 4. While the first square 110 and the second square 120a or 120b may have equal lengths of b1 in the first direction y, example embodiments are not limited to the above.

An overlap region between the first aperture 102 of the first mask 100 and the second aperture 202 of the second mask 200 is different in FIGS. 7A and 7B. However, the size of the overlap region shown in FIG. 7A is substantially the same as that of the overlap region shown in FIG. 7B. This indicates that each second pre-electron beam 2 passes through a different, but same-sized region of the second aperture 202. Even if each second pre-electron beam 2 passes through a different region of the second aperture 202 to form the second electron beam 4, the second electron beam 4 may be irradiated to the same location on the resist 300, thereby forming the second transfer pattern 410 at the same location on the resist 300. Specifically, the path of the second pre-electron beam 2 emerging from the first aperture 102 may be changed by the shaping deflector 32, and the changed path of the second pre-electron beam 2 may change a location, to which the second pre-electron beam 2 is irradiated, on the second mask 200. Even if the location, to which the second pre-electron beam 2 is irradiated, on the second mask 200 is changed, the size of an overlap region between the second pre-electron beam 2 and the second aperture 202 can be adjusted to substantially the same size every time by controlling the shaping deflector 32. Each second electron beam 4 emerging from a different region of the second aperture 202 may be irradiated to the same location on the resist 300 by using the main deflector 42 (see FIG. 1).

In the pattern forming method according to the current embodiment, the overlap region 110 (see FIG. 5) between the second aperture 202 of the second mask 200 and the first pre-electron beam may include the overlap region 120a between the second aperture 202 and the second pre-electron beam. That is, locations, to which the first and second pre-electron beams are irradiated, on the second mask 200 may overlap. If the first and second electron beams 3 and 4 are formed in this way, there is no need to greatly change the path of the second pre-electron beam, which emerges through the first aperture 102, from the path of the first pre-electron beam.

Referring to FIGS. 1 and 6A, the second electron beam 4 whose path has been changed by the main deflector 42 may be irradiated onto the resist 300. The irradiated second electron beam 4 forms the second transfer pattern 410 on portions of the boundary 400s of the first transfer pattern 400 which extend in the first direction y. That is, the second transfer pattern 410 may be formed in the boundary 400s of the first transfer pattern 400 corresponding to a region of the resist 300 which was not exposed to a sufficient dose of electrons in the process of forming the first transfer pattern 400, i.e., irradiation of the second electron beam 4 may supplement the insufficient exposure of the boundary 400s to the first electron beam 3. The formation of the second transfer pattern 410, i.e., the additional exposure to an electron beam irradiation, may reduce the LER that may occur when a region of the resist 300 corresponding to the boundary 400s of the first transfer pattern 400 is exposed to an insufficient dose of electrons. Effects related to the formation of the second transfer pattern 410 will be described later with reference to FIG. 8.

Referring to FIG. 6A, the second transfer pattern 410 has a length of w2 in the second direction x and a length of h1 in the first direction y. The second transfer pattern 410 may be smaller than the first transfer pattern 400. The first transfer pattern 400, the second transfer pattern 410, and overlap regions 400d of the first and second transfer patterns 400 and 410 have equal lengths of h1 in the first direction y. However, the length w1 of the first transfer pattern 400 in the second direction x is greater than the length w2 of the second transfer pattern 410 in the second direction x. This is because the second transfer pattern 410 is formed to supply more electrons to the boundary 400s of the first transfer pattern 400 corresponding to a region of the resist 300 which was exposed to an insufficient dose of electrons. In the pattern forming method according to the current embodiment, a length w2 of the overlap regions 400d between the first and second transfer patterns 400 and 410 in the second direction x may substantially equal the length w2 of the second transfer pattern 410 in the second direction x, but is not limited thereto. In addition, the second transfer pattern 410 may be formed within the first transfer pattern 400. In the drawing, the length w2 of the second transfer pattern 410 in the second direction x is, but not limited to, substantially equal to the width of the boundary 400s of the first transfer pattern 400.

Referring to FIG. 6B, the third electron beam emerging from the second aperture 202 is irradiated to the resist 300, thereby forming the third electron pattern 420. The third electron pattern 420 is formed on portions of the boundary 400s of the first transfer pattern 400 which extend in the second direction x. The third transfer pattern 420 has a length of w1 in the second direction x and a length of h2 in the first direction y. However, example embodiments are not limited thereto, e.g., the third transfer pattern 420 may have the same width as the boundary 400s of the first transfer pattern 400 and may be formed within the first transfer pattern 400.

Referring to FIGS. 4, 6A and 6B, one or more first transfer patterns 400 may be formed in the second direction x, and then the second transfer pattern 410 may be formed in the second direction x. Specifically, the first transfer pattern 400 extending in the first direction y may be formed continuously in the second direction x. The path of the first electron beam 3 whose cross section is the first square 110 (see FIG. 5) may be changed using the main deflector 42 (see FIG. 1). Thus, the first transfer pattern 400 may be formed on the resist 300 by changing the path of the first electron beam 3 according to a designed pattern. That is, the first electron beam 3 forms the first transfer pattern 400 only. Then, the second transfer pattern 410 may be formed in portions of the boundary 400s of the first transfer pattern 400 which extend in the first direction y. The second transfer pattern 410 may be formed by changing the path of the second electron beam 4, which has a smaller cross section than the first electron beam 3, using the main deflector 42. The second electron beam 4 that forms the second transfer pattern 410 may travel in a same direction as the first electron beam 3 that forms the first transfer pattern 400. The width w2 of the second transfer pattern 410 may be designed in view of the width w1 of the first transfer pattern 400 and the intensity of the first electron beam 3 irradiated to form the first transfer pattern 400. Subsequently, the third transfer pattern 420 may be formed in portions of the boundary 400s of the first transfer pattern 400 which extend in the second direction x. In the current embodiment, a case where the second transfer pattern 410 is formed in the second direction x after the first transfer pattern 400 is formed in the second direction x has been described as an example. However, the example embodiment is not limited to this case. That is, after one first transfer pattern 400 is formed, the second transfer pattern 410 may be formed on both sides of the first transfer pattern 400, and this set of the first and second transfer patterns 400 and 410 may be repeated.

Electron doses used to form the first transfer pattern 400 and the second transfer pattern 410 and patterns formed according to the current embodiment will now be described with reference to FIGS. 6A and 8. A case where the second transfer pattern 410 is included in the first transfer pattern 400 will be described as an example. First, the first transfer pattern 400 is formed by irradiating the first electron beam 3 to the resist 300. Here, the first transfer pattern 400 has a width of w1. However, a region of the first transfer pattern 400 corresponding to a region of the resist 300 which was exposed to a sufficient dose of electrons has a width of w1-w2. That is, referring to a curve (i) representing the electron dose across the cross section of the first transfer pattern 400, a region of the resist 300 corresponding to a middle region of the first transfer pattern 400 was exposed to a dose higher than a critical point (CP) at which sufficient exposure is achieved. However, a region of the resist 300 corresponding to the boundary 400s of the first transfer pattern 400 was exposed to a dose lower than the CP. Thus, the region of the resist 300 corresponding to the boundary 400s was exposed incompletely.

Next, the second transfer pattern 410 having a width of w2 is formed in the boundary 400s of the first transfer pattern 400 corresponding to the incompletely exposed region of the resist 300. Here, a dose of electrons used per unit area to form the second transfer pattern 410 is higher than a dose of electrons used per unit area to form the first transfer pattern 400. The dose of electrons used per unit area to form a pattern can be increased by increasing the intensity of an electron beam irradiated to form the pattern or by increasing a period of time during which the resist 300 is exposed to the electron beam. Referring to a curve (ii) representing the electron dose across the cross section of the second transfer pattern 410, the dose of electrons used to form the second transfer pattern 410 has a higher value than the CP at which sufficient exposure is achieved. In addition, the gradient of the curve (ii) is steeper than that of the curve (i). Referring to a curve (iii) representing the electron dose across the cross section of a pattern formed by the first transfer pattern 400 and the second transfer pattern 410, the dose of electrons used to form the pattern is higher than the CP across the entire width w1 of the pattern. In particular, the dose is far higher than the CP in a boundary of the pattern. Since the dose curve (iii) has a far higher value than the CP in the boundary of the pattern, the dose gradient of the curve (iii) with respect to distance is steeper than that of the curve (i) in the boundary of the pattern.

Effects brought about by the use of the first transfer pattern 400 and the second transfer pattern 410 will now be described with reference to FIG. 8. When a pattern of less than 100 nm is formed using a conventional electron beam photolithography, e.g., when a pattern is formed using the first transfer pattern 400 only without the second transfer pattern 410, the number of electrons used for exposure may be physically limited. As a result, the LER of the pattern may be increased, e.g., since the boundary 400s of the first transfer pattern 400 is a region of the resist 300 which is exposed incompletely. The relatively high LER in pattern formed by the conventional electron beam photolithography may limit a reduction in linewidth sought by recent semiconductor processes to achieve a fine linewidth.

While the LER of the pattern may generally be decreased by increasing a length of exposure time, i.e., time the resist 300 is exposed to an electron beam, e.g., a dose profile of the curve (i), the increased exposure time may cause, e.g., outgassing from the resist 300 and remains of the resist 300. Moreover, as increased exposure time does not require an increased dose in the boundary, i.e., a dose gradient with respect to distance is not steep in a boundary of the pattern, a change in process conditions may lead to a change in a width of the pattern, thus decreasing process stability. Further, while the LER of the pattern may also be reduced by increasing the dose used to form the first transfer pattern 400, e.g., to a dose several times higher than that of the curve (i), the increased dose may reduce process efficiency because extra electrons are provided to unnecessary regions, e.g., despite the lack of change in process conditions and pattern linewidth (which secure process stability) due to steep dose gradient with respect to distance in the boundary of the pattern.

Therefore, when a pattern is formed using the pattern forming method according to the current embodiment, there is no need to greatly increase either the exposure time or the dose used to form the pattern. That is, the LER of the first transfer pattern 400 may be reduced by forming the second transfer pattern 410, i.e., exposing the boundary 400s of the first transfer pattern 400 to additional electron beam irradiation, on the boundary 400s of the first transfer pattern 400. Further, the method of forming patterns according to example embodiments may increase process efficiency. Moreover, since the dose gradient with respect to distance is steep in the boundary of the first transfer pattern, a change in the process conditions hardly changes a width of the pattern, thereby securing the process stability.

Hereinafter, a pattern forming method according to another example embodiment will be described with reference to FIGS. 1 and 9 through 11B. FIGS. 9 through 11B are diagrams illustrating a pattern forming method according to another example embodiment.

Figure 9:
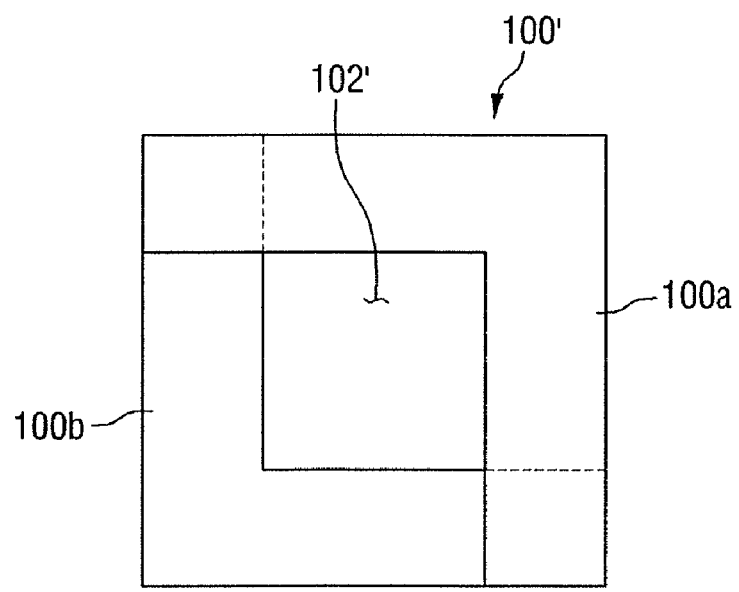
FIGS. 9 through 11B illustrate diagrams illustrating a pattern forming method according to another embodiment of the example embodiment.
Figure 10A:
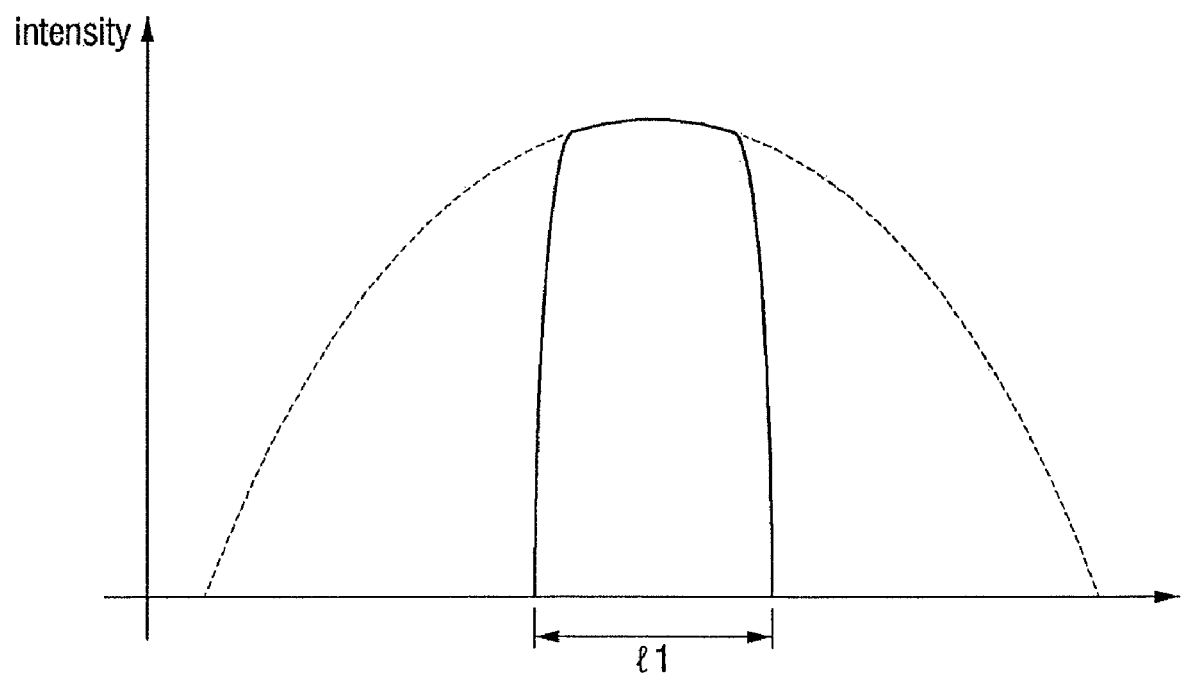
Figure 10B:
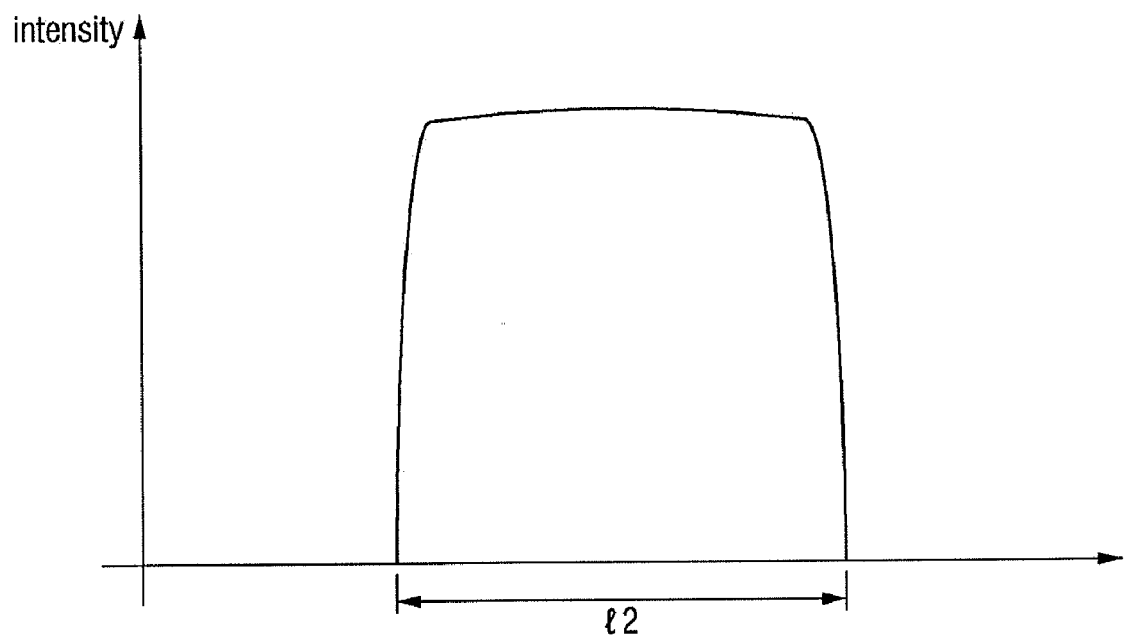
Figure 11A:
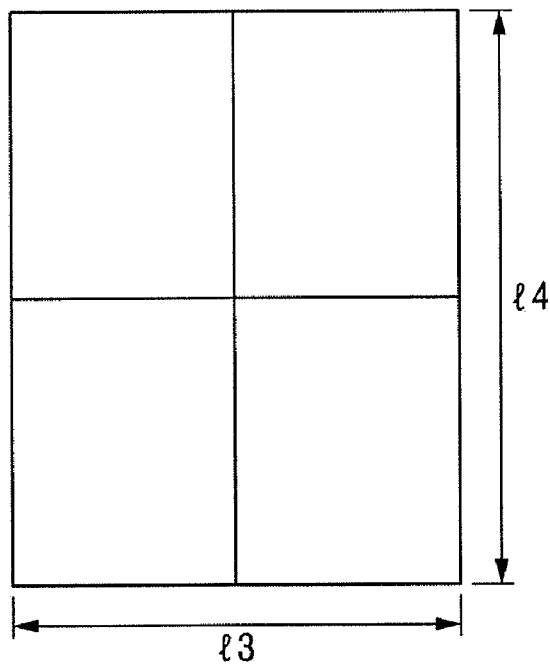
Figure 11B:
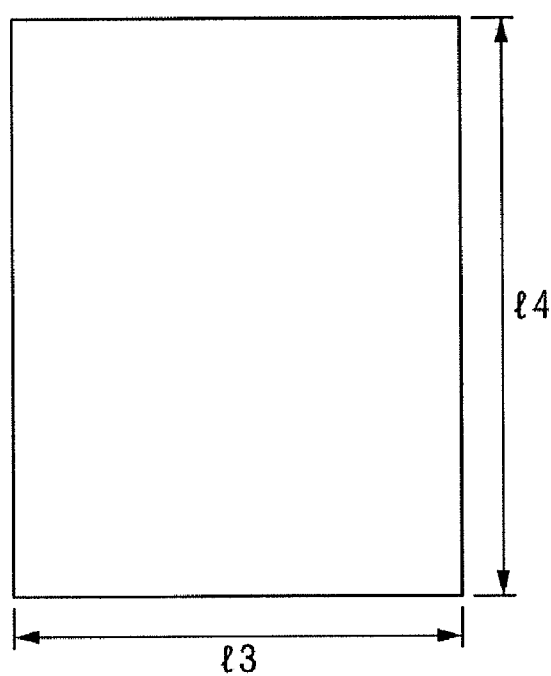

FIG. 9 illustrates a first mask 100' with a first aperture 102'. FIGS. 10A-10B are graphs illustrating a usable portion of an electron beam when a conventional first mask and the first mask 100 of FIG. 9, respectively, are used. FIGS. 11A and 11B are diagrams illustrating the pattern forming method according to the current embodiment.

Referring to FIGS. 1 and 9, the first mask 100' having the first aperture 102' may include two L-shaped structures. An end of a first L-shaped structure 100a of the first mask 100' partially overlaps an end of a second L-shaped structure 100b of the first mask 100' (overlapped region indicated by dashed lines), thereby forming the first aperture 102'. A size of the first aperture 102' can be changed by moving the first and second L-shaped structures 100a and 100b relative to each other. While the first mask 100' includes the two L-shaped structures 100a and 100b in the current embodiment, example embodiments are not limited thereto.

Referring to FIGS. 1 and 9, the pre-electron beam 1 emitted from the electron gun 10 passes through the first aperture 102' in the first mask 100'. When the pre-electron beam 1 passes through the first aperture 102', a cross section of the pre-electron beam 1 is determined by the first aperture 102'. That is, the cross section of the pre-electron beam 1 emitted from the electron gun 10 is not limited to a particular size. However, when the pre-electron beam 1 passes through the first aperture 102', the size and shape of the cross section of the pre-electron beam 1 is changed by the first aperture 102' to the size and shape of the first aperture 102'. Thus, the size and shape of the cross section of the pre-electron beam 2 emerging from the first aperture 102' are substantially the same as the size and shape of the first aperture 102'. Therefore, if the size of the first aperture 102' in the first mask 100' is changed, the size of the cross section of the pre-electron beam 2 emerging from the first aperture 102' is also changed. Accordingly, the size of the pre-electron beam 2 incident on the second mask 200 is changed. For example, if the size of the first aperture 102' is increased by moving the two L-shaped structures 100a and 100b, the size of the cross section of the pre-electron beam 2 emerging from the first aperture 102 to be incident onto the second mask 200 also increases. In another example, if the size of the first aperture 102' is reduced by moving the two L-shaped structures 100a and 100b, the size of the cross section of the pre-electron beam 2 decreases.

The intensity distribution of an electron beam emitted from the electron gun 10 and a maximum size of a transfer pattern formed on a resist will now be described with reference to FIGS. 1 and 10A. The first pre-electron beam 1 emitted from the electron gun 10 has a Gaussian distribution with respect to distance from an emission axis. That is, as the distance from the emission axis increases, the intensity of the first pre-electron beam 1 decreases. In the case of an electron beam with non-uniform intensity, the intensity of the electron beam varies significantly according to the location of a pattern to be formed. For this reason, only a portion of an emitted electron beam, i.e., a portion with substantially uniform intensity, is selected and used to form a pattern. That is, only a portion of an emitted electron beam spread (spread indicated by a dashed line in FIG. 10, may be used to form a pattern, e.g., a portion having a width of l1 in FIG. 10A. In detail, when the pre-electron beam 1 passes through the first aperture 102' of the first mask 100', only a portion corresponding to l1 is selected. Therefore, a transfer pattern wider than l1 cannot be formed on the resist at a time. In addition, only some of the electrons generated by the electron gun 10 are used, and the remaining electrons are discarded.

A method of increasing a width of a portion of an electron beam which is used to form a pattern by increasing the size of the first aperture 102' in the first mask 100' will now be described with reference to FIGS. 9, 10B, and 10C. Referring to FIG. 10B, of an electron beam emitted from the electron gun 10, a portion allowed to pass through the first aperture 102' is increased by increasing the size of the first aperture 102' in the first mask 100'. That is, a maximum width of the portion of the electron beam used to form a transfer pattern on a resist is increased from l1, i.e., the portion indicated in FIG. 10A, to l2, i.e., a portion indicated in FIG. 10B. Accordingly, a large pattern can be formed at one time instead of being formed by irradiating the electron beam multiple times. However, since the portion of the electron beam still has the Gaussian distribution, the intensity of a peripheral region of the portion which emerges from the first aperture 102' is reduced sharply.

Figure 10C:
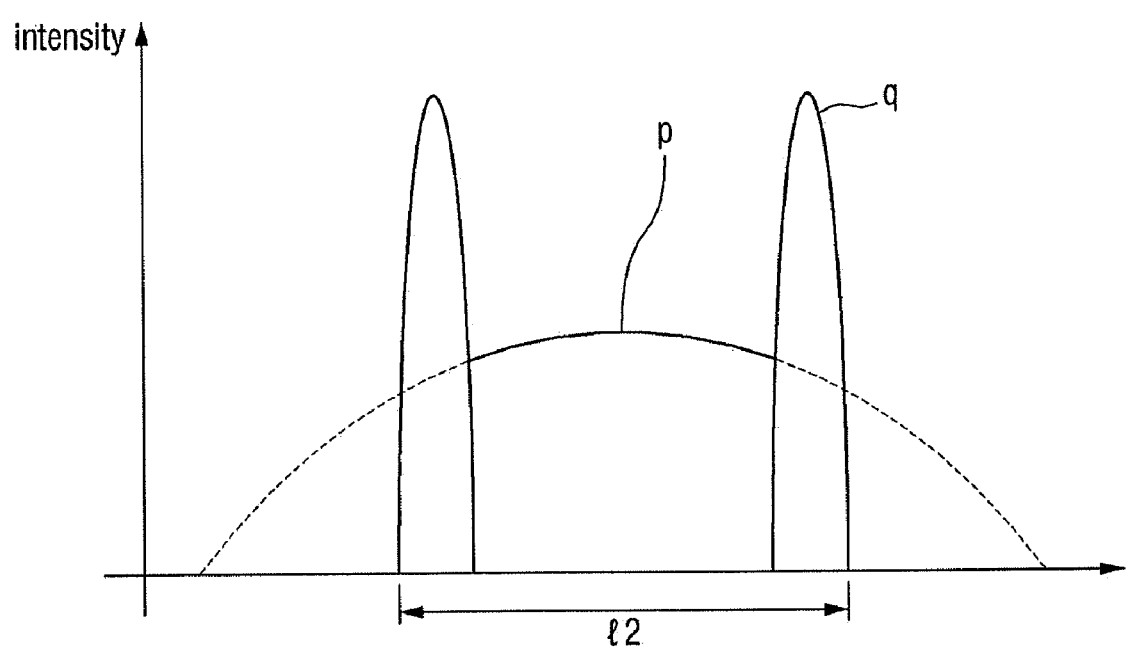

Referring to FIG. 10C, of an electron beam emitted from the electron gun 10, a portion having a width of l2 is selected by the first aperture 102 of the first mask 100. Then, the selected portion that emerges from the first aperture 102 is irradiated onto a resist, thereby forming a first transfer pattern having a width of l2. Here, a peripheral portion of the first transfer pattern having the width of l2 corresponds to a region of the resist which was not exposed to a sufficient dose of electrons and thus was exposed incompletely. Therefore, a second transfer pattern which overlaps the peripheral portion of the first transfer pattern is formed on the resist. The formation of the first and second transfer patterns allows the peripheral portion of the first transfer pattern to be exposed to a sufficient dose of electrons. Consequently, since a transfer pattern having a width of l2 can be formed at one time, the process time can be reduced while the process efficiency is increased. In FIG. 10C, a curve p represents the dose of the selected portion of the electron beam which emerges from the first aperture 102 and has a Gaussian distribution with respect to a distance across the first transfer pattern having a width of l2. A curve q represents the dose distribution with respect to a distance across the second transfer pattern formed in the peripheral portion of the first transfer pattern corresponding to a region of the resist which was exposed to an insufficient dose of electrons. Therefore, the exposure dose with respect to distances across patterns formed by the first and second transfer patterns becomes similar to the graph of FIG. 8. Accordingly, a pattern having a width of 12 can be formed at one time instead of being formed by irradiating an electron beam multiple times.

Referring to FIGS. 11A and 11B, an electron beam must be irradiated onto a resist four times in order to form a square transfer pattern whose sides have lengths of 13 and 14, respectively. Specifically, if the first aperture has a fixed size, the electron beam must be irradiated multiple times to form a pattern larger than a maximum cross section of the electron beam. This is because the square transfer pattern whose sides have the lengths of 13 and 14 cannot be formed by irradiating the electron beam once. However, if the size of the first aperture 102' in the first mask 100' is increased, the maximum size of the cross section of the electron beam irradiated to a resist also increases. Therefore, a square transfer pattern whose sides have the lengths of 13 and 14 may be formed at one time, i.e., via a single irradiation.

Hereinafter, a pattern forming method according to another embodiment will be described with reference to FIGS. 4 through 7B and 12 through 14B.

Figure 12:
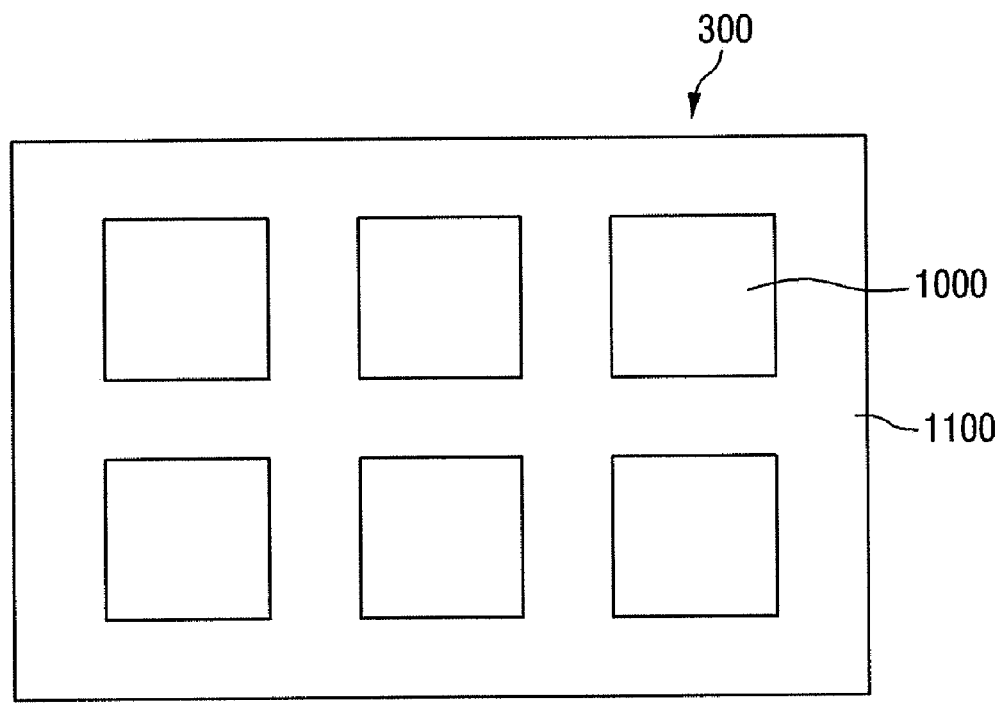
FIGS. 12 through 14B illustrate diagrams illustrating a pattern forming method according to another embodiment of the example embodiment.
Figure 13:
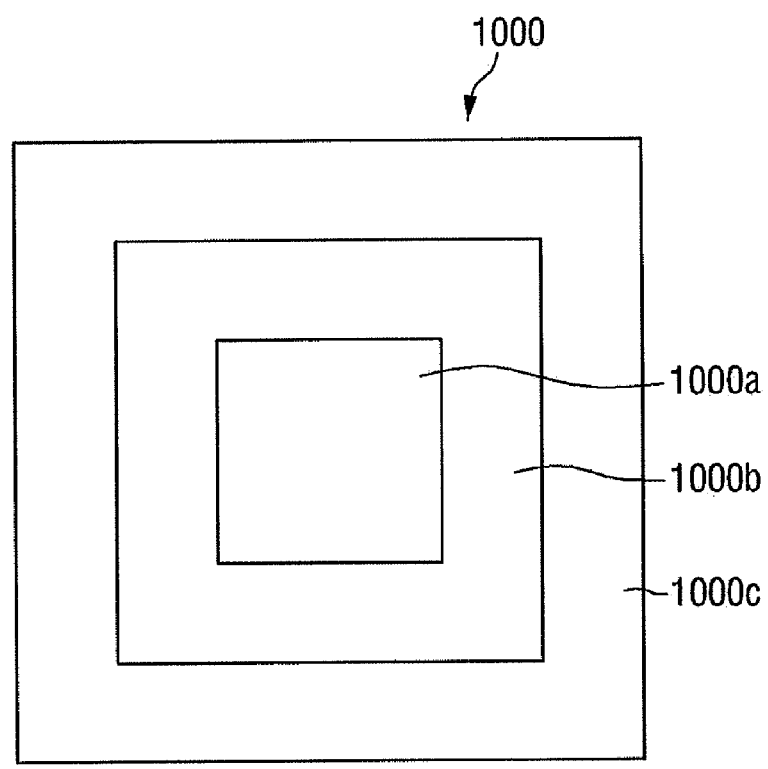
Figure 14A:
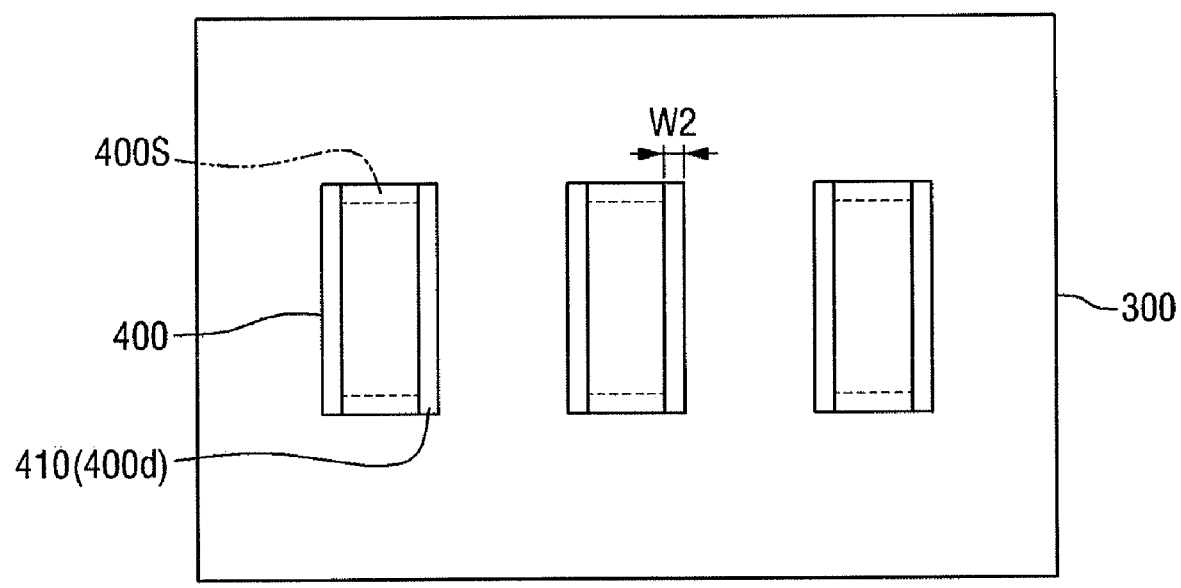
Figure 14B:
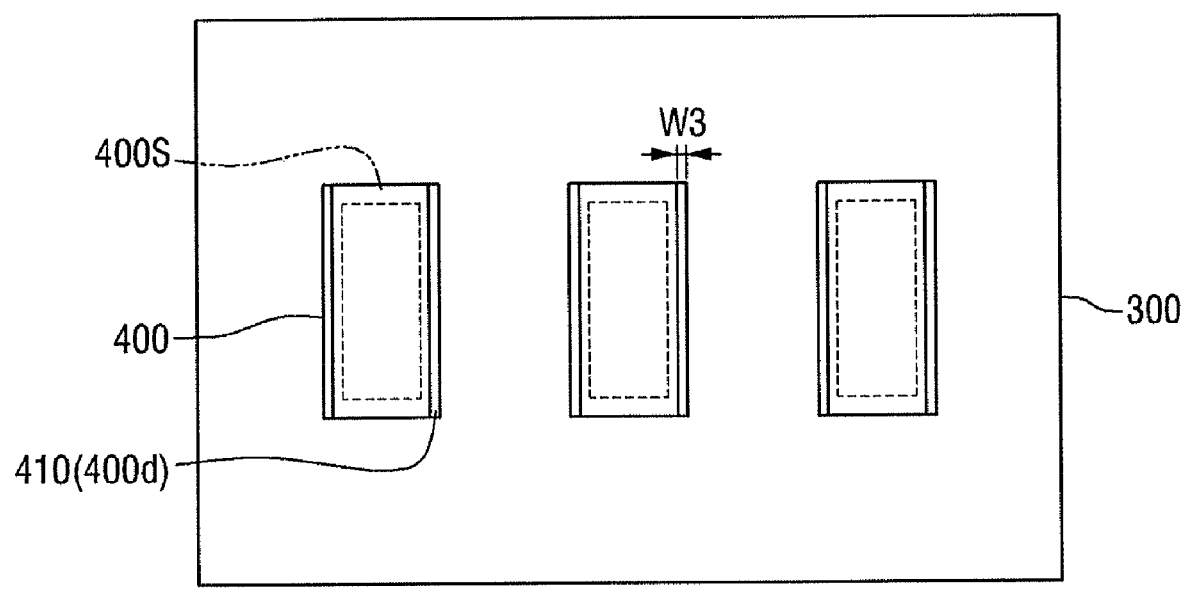

FIGS. 12 through 14B are diagrams illustrating a pattern forming method according to another example embodiment. FIG. 12 is a diagram of a resist 300 in which cell blocks 1000 and a surrounding region 1100 are formed using the pattern forming method according to the current embodiment. FIG. 13 is a diagram of a cell block 1000 shown in FIG. 12. FIGS. 14A and 14B are diagrams of transfer patterns formed in the cell block 1000 of FIG. 12.

Referring to FIGS. 4 through 7B, 12 and 13, the cell blocks 1000 and the surrounding region 1100 may be defined in the resist 300. Each of the cell blocks 1000 may include a central region 1000a, a transition region 1000b that surrounds the central region 1000a, and a peripheral region 1000c that surrounds the transition region 1000b. A memory part of a dynamic random access memory (DRAM) device may be placed in each of the cell blocks 1000, and a circuit part which is responsible for the operation of the DRAM device may be placed in the surrounding region 1100.

Referring to FIGS. 1, 4 through 7B, and 13 through 14B, the first electron beam 3 whose cross section is the first square 110 may be irradiated onto the resist 300 in which the cell blocks 1000 are defined. The irradiated first electron beam 3 forms the first transfer pattern 400, which extends in the first direction y and has the boundary 400s, on the resist 300. Then, the second electron beam 4, whose cross section is the second square 120a or 120b, may be irradiated onto the resist 300. The irradiated second electron beam 4 forms the second transfer pattern 410 on the resist 300. The second transfer pattern 410 includes regions 400d that overlap portions of the boundary 400s of the first transfer pattern 400 which extend in the first direction y. A width of the second transfer pattern 410 formed in each cell block 1000 may be reduced from the central region 1000a toward the peripheral region 1000b.

Referring to FIGS. 13 through 14B, the width of the second transfer pattern 410 including the regions 400d which overlap the first transfer pattern 400 may vary according to the region of each cell block 1000. For example, FIG. 14A is a diagram of the first and second transfer patterns 400 and 410 formed in the central region 1000a of each cell block 1000, and FIG. 14B is a diagram of the first and second transfer patterns 400 and 410 formed in the transition region 1000b of each cell block 1000. Referring to FIG. 14A, all second transfer patterns 410 formed in the central region 1000a have equal lengths of w2 in the second direction x. In addition, the overlap regions 400d, the second transfer pattern 410, and the first transfer pattern 400 have equal lengths in the first direction y. Referring to FIG. 14B, the second transfer pattern 410 formed in the transition region 1000b has a length of w3. That is, the length of the second transfer pattern 410 in the second direction x changes from the central region 1000a toward the peripheral region 1000c. The length of the second transfer pattern 410 formed in a part of the transition region 1000b which is adjacent to the central region 1000a is substantially equal to w2. However, the second transfer pattern 410 may not substantially be formed in a part of the transition region 1000b which is adjacent to the peripheral region 1000c. In addition, the first transfer pattern 400 may be formed in the peripheral region 1000c, but the second transfer pattern 410 may not be formed in the peripheral region 1000c. In other words, the width of an overlap region between the second transfer pattern 410 and the boundary 400s of the first transfer pattern 400 in the transition region 1000b may be gradually reduced as the distance to the peripheral region 1000c decreases.

As described above, the width of the second transfer pattern 410 may be reduced from the central region 1000a of each cell block 1000 toward the peripheral region 1000c. This is to prevent a proximity effect correction (PEC) error of an irradiated electron beam. The PEC error may be caused by a surrounding environment in which an electron beam is irradiated. That is, if a pattern, for example, is already formed in a region to which an electron beam is irradiated, it may affect the irradiated electron beam, thus changing the intensity of the irradiated electron beam. Therefore, the first and second transfer patterns 400 and 410 may be formed in the central region 1000a to reduce the LER. However, the second transfer pattern 410 may not be formed in the peripheral region 1000c which adjoins the surrounding region 1100 in order to minimize the effect of the surrounding region 1100. In addition, the width of the second transfer pattern 410 may be gradually increased from the peripheral region 1000c toward the central region 1000a in order to ensure the stability of transfer patterns formed in the central region 1000a. In this way, the PEC error that may occur between each cell block 1000 and the surrounding region 1100 may be minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the example embodiment as set forth in the following claims.

What is claimed is:

1. A pattern forming method, comprising:
providing a first mask with a first aperture;
forming a first transfer pattern on a resist by irradiating a first electron beam through the first aperture, the first transfer pattern extending in a first direction and having a boundary along a circumference thereof, and the first electron beam having a cross section of a first square when emerging from the first aperture; and
forming a second transfer pattern on the resist by irradiating a second electron beam through the first aperture, the second transfer pattern extending in the first direction and overlapping a portion of the boundary of the first transfer pattern, and the second electron beam having a cross section of a second square when emerging from the first aperture, wherein the second electron beam has a higher intensity than the first electron beam.

2. The method as claimed in claim 1, further comprising forming at least one first transfer pattern in the second direction different from the first direction, and forming the second transfer pattern in the second direction.

3. The method as claimed in claim 1, wherein the first transfer pattern, the second transfer pattern, and the overlapped portion of the boundary have equal lengths in the first direction, the first transfer pattern being longer than the second transfer pattern in a second direction different from the first direction.

4. The method as claimed in claim 1, wherein the first square is an overlap region between the first aperture and a first pre-electron beam, the second square is an overlap region between the first aperture and a second pre-electron beam, and the first square and the second square have equal lengths in the first direction, the first square being longer than the second square in a second direction different from the first direction.

5. The method as claimed in claim 4, wherein the overlap region between the first aperture and the first pre-electron beam includes the overlap region between the first aperture and the second pre-electron beam.

6. The method as claimed in claim 1, wherein forming the second transfer pattern includes irradiating a dose of electrons per unit area that is higher than a dose of electrons irradiated per unit area to form the first transfer pattern.

7. The method as claimed in claim 1, wherein each of the first electron beam and the second electron beam has an intensity to form a transfer pattern on the resist.

8. The method as claimed in claim 1, wherein the second transfer pattern is formed within the first transfer pattern.

9. The method as claimed in claim 1, further comprising:
providing a second mask with a second aperture, such that a shaping deflector is positioned between the first and second masks;
irradiating a first pre-electron beam sequentially through the first aperture of the first mask, the shaping deflector, and the second aperture of the second mask to form the first electron beam, such that the first electron beam emerging from the second aperture has a cross section that is an overlap region between the first square and the second aperture of the second mask; and
irradiating a second pre-electron beam sequentially through the first aperture of the first mask, the shaping deflector, and the second aperture of the second mask to form the second electron beam, such that the second electron beam emerging from the second aperture has a cross section that is an overlap region between the second square and the second aperture of the second mask.

10. The method as claimed in claim 9, further comprising changing a size of a cross section of the first pre-electron beam incident on the first mask and a size of a cross section of the second pre-electron beam incident on the first mask by changing a size of the second aperture.

11. The method as claimed in claim 10, wherein the second mask includes two L-shaped structures defining the second aperture, changing the size of the second aperture includes moving the two L-shaped structures.

12. The method as claimed in claim 9, further comprising:
electrically connecting a plurality of amplifiers to the shaping deflector; and
controlling outputs of the amplifiers to adjust the cross section of the second electron beam that is an overlap region between the second square and the second aperture of the second mask.

13. A pattern forming method, comprising:
providing a first mask with a first aperture;
providing a second mask with a second aperture, a shaping deflector being positioned between the first and second masks;
irradiating a first pre-electron beam sequentially through the first aperture, the shaping deflector, and the second aperture to form a first electron beam, a cross-section of the first electron beam being defined by a first overlap between the first and second apertures;
irradiating the first electron beam on a resist to form a first transfer pattern;
irradiating a second pre-electron beam sequentially through the first aperture, the shaping deflector, and the second aperture to form a second electron beam, a cross-section of the second electron beam being defined by a second overlap between the first and second apertures; and
irradiating the second electron beam on a resist to form a second transfer pattern, the second transfer pattern overlapping a portion of a boundary of the first transfer pattern,
wherein the second electron beam has a higher intensity than the first electron beam.

14. The method as claimed in claim 13, wherein irradiating the second electron beam includes forming the second transfer pattern only on portions of the boundary of the first transfer pattern, such that the second transfer pattern does not overlap a central portion of the first transfer pattern.

15. The method as claimed in claim 13, wherein irradiating the first and second electron beams includes irradiating electron beams having different cross-sections, the cross-section of the second electron beam being substantially smaller than that of the first electron beam.

16. The method as claimed in claim 13, wherein defining the cross-section of the second electron beam includes adjusting an electric field generated by the shaping deflector, such that a path of the second electron beam is controlled to be incident on a predetermined region of the second mask.

17. The method as claimed in claim 16, wherein controlling the second electron beam to be incident on the predetermined region of the second mask includes controlling a size and a shape of the second overlap.

18. A pattern forming method, comprising:
providing a resist, a cell block being defined in the resist;
forming a first transfer pattern in the cell block by irradiating a first electron beam, the first transfer pattern extending in a first direction and having a boundary along a circumference thereof, and the first electron beam having a cross section of a first square; and
forming a second transfer pattern in the cell block by irradiating a second electron beam, the second transfer pattern extending in the first direction and having regions that overlap portions of the boundary, and the second electron beam having a cross section of a second square,
wherein the cell block includes a central region, a transition region surrounding the central region, and a peripheral region surrounding the transition region, a width of the second transfer pattern being reduced from the central region toward the peripheral region, and
wherein the second electron beam has a higher intensity than the first electron beam.

19. The method as claimed in claim 18, wherein the second transfer pattern having a predetermined width is formed in the central region, the first transfer pattern only being formed in the peripheral region, and the second transfer pattern being formed in the transition region, such that the width thereof is gradually reduced as a distance to the peripheral region decreases.

20. The method as claimed in claim 18, wherein:
the first electron beam is formed by passing a first pre-electron beam through a first aperture in a first mask, the first square being an overlap region between the first aperture and the first pre-electron beam, the second electron beam is formed by passing a second pre-electron beam through the first aperture, the second square being an overlap region between the first aperture and the second pre-electron beam, and the first square and the second square have equal lengths in the first direction, the first square being longer than the second square in a second direction different from the first direction.

* * * * *